(12) United States Patent
Park et al.

(10) Patent No.: US 12,183,725 B2
(45) Date of Patent: Dec. 31, 2024

(54) DISPLAY DEVICE WITH PLURALITY OF COLOR FILTER PATTERNS

(71) Applicant: Samsung Display Co., Ltd., Yongin-si (KR)

(72) Inventors: Do Yeong Park, Yongin-si (KR); Kyung Bae Kim, Yongin-si (KR); Mee Hye Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 399 days.

(21) Appl. No.: 17/355,025

(22) Filed: Jun. 22, 2021

(65) Prior Publication Data

US 2022/0130810 A1   Apr. 28, 2022

(30) Foreign Application Priority Data

Oct. 22, 2020  (KR) .................. 10-2020-0137838

(51) Int. Cl.
 *H01L 29/20* (2006.01)
 *H01L 25/16* (2023.01)
 *H01L 33/00* (2010.01)
 *H01L 33/50* (2010.01)

(52) U.S. Cl.
 CPC .......... *H01L 25/167* (2013.01); *H01L 33/507* (2013.01)

(58) Field of Classification Search
 CPC . H01L 25/167; H01L 33/507; H01L 25/0753; H01L 33/20; H01L 33/58; H01L 33/62; H01L 27/1214; G02B 5/201
 See application file for complete search history.

(56) References Cited

U.S. PATENT DOCUMENTS

| | | | |
|---|---|---|---|
| 9,825,067 B2 | 11/2017 | Rhee | |
| 10,211,418 B2 | 2/2019 | Im et al. | |
| 10,276,630 B2 | 4/2019 | Lee et al. | |
| 10,340,419 B2 | 7/2019 | Kim et al. | |
| 11,088,301 B2 | 8/2021 | Choi et al. | |
| 2015/0362165 A1* | 12/2015 | Chu | H01L 33/32 362/235 |
| 2019/0237637 A1* | 8/2019 | Cheng | H01L 33/44 |
| 2019/0245120 A1* | 8/2019 | Choi | H01L 33/58 |
| 2020/0013766 A1* | 1/2020 | Kim | H01L 25/167 |

(Continued)

FOREIGN PATENT DOCUMENTS

| | | |
|---|---|---|
| KR | 10-2017-0086366 A | 7/2017 |
| KR | 10-2018-0009014 A | 1/2018 |

(Continued)

*Primary Examiner* — Ismail A Muse
(74) *Attorney, Agent, or Firm* — Lewis Roca Rothgerber Christie LLP

(57) ABSTRACT

A display device according to an embodiment of the present disclosure includes a first pixel including a first sub-emission area and a second sub-emission area that are spaced from each other, and first light-emitting elements in the first and second sub-emission areas, the first light-emitting elements being configured to emit light having a first color; a light blocking pattern on the first pixel to cover an area between the first sub-emission area and the second sub-emission area and including a plurality of openings respectively corresponding to the first and second sub-emission areas; and a first color filter including a plurality of first color filter patterns disposed on the first and second sub-emission areas.

19 Claims, 22 Drawing Sheets

(56) References Cited

U.S. PATENT DOCUMENTS

| | | | |
|---|---|---|---|
| 2020/0273906 A1 | 8/2020 | Li et al. | |
| 2021/0026192 A1* | 1/2021 | Kim | G02F 1/133512 |
| 2021/0217739 A1* | 7/2021 | Lee | H01L 33/50 |
| 2021/0265324 A1 | 8/2021 | Kong et al. | |
| 2021/0305225 A1* | 9/2021 | Kim | H01L 25/167 |
| 2021/0343784 A1 | 11/2021 | Kwag et al. | |
| 2021/0351171 A1* | 11/2021 | Yoo | H01L 27/1214 |
| 2021/0408104 A1* | 12/2021 | Lee | H01L 25/0753 |
| 2022/0029058 A1* | 1/2022 | Kim | H01L 33/385 |
| 2022/0052022 A1* | 2/2022 | Yu | H01L 24/32 |
| 2022/0084999 A1* | 3/2022 | Lee | H01L 33/44 |
| 2022/0115470 A1* | 4/2022 | Kim | H10K 59/122 |
| 2022/0131038 A1* | 4/2022 | Park | H01L 33/36 |
| 2022/0190203 A1* | 6/2022 | Kim | H01L 33/62 |
| 2022/0216264 A1* | 7/2022 | Park | H01L 27/156 |
| 2022/0336707 A1* | 10/2022 | Shin | H01L 25/0753 |
| 2022/0344379 A1* | 10/2022 | Yun | H01L 25/167 |

FOREIGN PATENT DOCUMENTS

| | | | |
|---|---|---|---|
| KR | 10-2018-0009015 A | 1/2018 | |
| KR | 10-2018-0011404 A | 2/2018 | |
| KR | 10-2018-0028822 A | 3/2018 | |
| KR | 10-2020-0010706 A | 1/2020 | |
| KR | 10-2020-0014955 A | 2/2020 | |
| KR | 10-2020-0027136 A | 3/2020 | |
| KR | 10-2020-0042997 A | 4/2020 | |
| KR | 10-2022-0053764 A | 5/2022 | |

\* cited by examiner

PXL: PXL1, PXL2, PXL3

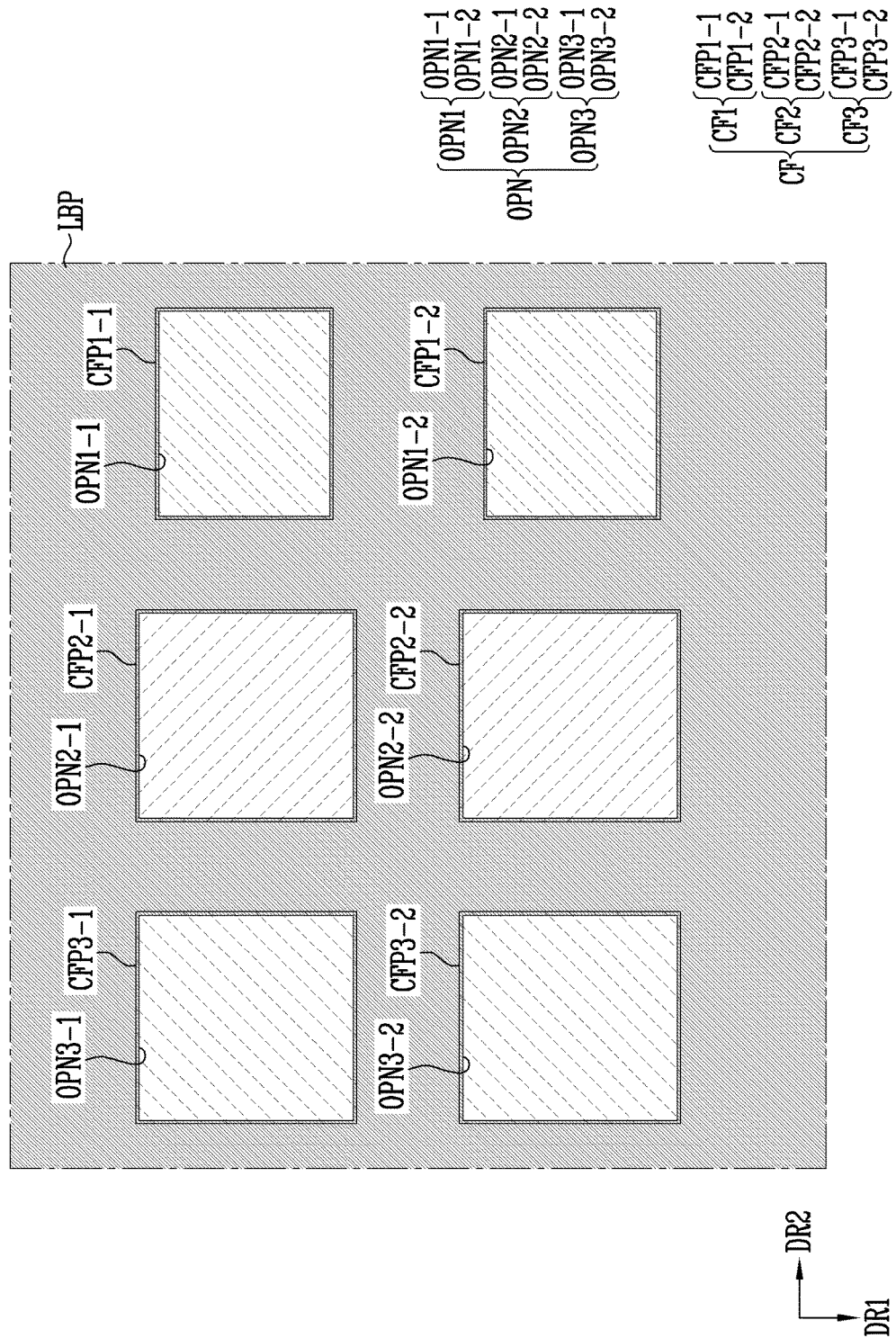

DISPLAY DEVICE WITH PLURALITY OF COLOR FILTER PATTERNS

CROSS-REFERENCE TO RELATED APPLICATION

This application claims priority to and the benefit of Korean Patent Application No. 10-2020-0137838 filed in the Korean Intellectual Property Office on Oct. 22, 2020, the entire content of which is incorporated herein by reference.

BACKGROUND

1. Field

Embodiments of the present disclosure relate to a display device.

2. Description of the Related Art

Recently, interest in information displays is increasing. Accordingly, research and development for display devices are continuously being conducted.

SUMMARY

An embodiment of the present disclosure provides a display device capable of reducing reflectance of external light and also securing luminous efficiency of a pixel.

A display device according to an embodiment of the present disclosure includes a first pixel including a first sub-emission area and a second sub-emission area that are spaced from each other, and first light-emitting elements in the first and second sub-emission areas, the first light-emitting elements being configured to emit light having a first color; a light blocking pattern on the first pixel to cover an area between the first sub-emission area and the second sub-emission area and including a plurality of openings respectively corresponding to the first and second sub-emission areas; and a first color filter including a plurality of first color filter patterns on the first and second sub-emission areas.

In an embodiment, the first color filter patterns may be separated from each other with the light blocking pattern interposed therebetween.

In an embodiment, at least one of the first light-emitting elements in the first sub-emission area and at least one of the first light-emitting elements in the second sub-emission area may be connected in series.

In an embodiment, the first pixel may include a first electrode and a second electrode in the first sub-emission area; at least one of the first light-emitting elements in the first sub-emission area and connected between the first electrode and the second electrode; a third electrode and a fourth electrode in the second sub-emission area; at least one of the first light-emitting elements in the second sub-emission area and connected between the third electrode and the fourth electrode; and at least one contact electrode configured to connect any one of the first and second electrodes and any one of the third and fourth electrodes.

In an embodiment, the display device may further include a bank surrounding an emission area of the first pixel including the first and second sub-emission areas.

In an embodiment, at least a portion of the bank may be also located between the first sub-emission area and the second sub-emission area and may include an opening exposing an area between the first sub-emission area and the second sub-emission area.

In an embodiment, the bank may include openings corresponding to areas including the first and second sub-emission areas and a non-emission area between the first sub-emission area and the second sub-emission area.

In an embodiment, the first color filter may be a color filter corresponding to the first color.

In an embodiment, the display device may further include a second pixel adjacent to the first pixel and including a first sub-emission area and a second sub-emission area that are spaced from each other, and second light-emitting elements in the first and second sub-emission areas and configured to emit a same color light; and a third pixel adjacent to the second pixel and including a first sub-emission area and a second sub-emission area that are spaced from each other, and third light-emitting elements in the first and second sub-emission areas and configured to emit a same color light.

In an embodiment, the display device may further include a second color filter including second color filter patterns corresponding to a second color, the second color filter patterns being on the first and second sub-emission areas of the second pixel and being spaced from each other with the light blocking pattern interposed therebetween; and a third color filter including third color filter patterns corresponding to a third color, the third color filter patterns being on the first and second sub-emission areas of the third pixel and being spaced from each other with the light blocking pattern interposed therebetween.

In an embodiment, the light blocking pattern may be on the first to third pixels and overlapping non-emission areas between the first sub-emission areas and the second sub-emission areas of the first to third pixels. The light blocking pattern may include a plurality of first openings corresponding to the first and second sub-emission areas of the first pixel, a plurality of second openings corresponding to the first and second sub-emission areas of the second pixel, and a plurality of third openings corresponding to the first and second sub-emission areas of the third pixel.

In an embodiment, a size of each of the first openings may be smaller than a size of each of the second and third openings.

In an embodiment, the second light-emitting elements may be second color light-emitting elements, and the third light-emitting elements may be third color light-emitting elements.

In an embodiment, the second and third light-emitting elements may be first color light-emitting elements. The display device may further include a first color conversion layer on the second pixel to convert a first color light emitted from the second light-emitting elements into a second color light, and a second color conversion layer on the third pixel to convert the first color light emitted from the third light-emitting elements into a third color light.

In an embodiment, the first color conversion layer may be between the second light-emitting elements and the second color filter, and the second color conversion layer may be between the third light-emitting elements and the third color filter.

In an embodiment, the first and second color conversion layers may be on one surface of a substrate on which the first to third color filters are located.

In an embodiment, the first and second color conversion layers may be on one surface of a base layer on which the first to third light-emitting elements are located, and the first to third color filters may be disposed on one surface of a substrate so as to face the one surface of the base layer.

In an embodiment, the first and second color conversion layers and the first to third color filters may be sequentially formed on one surface of a base layer on which the first to third light-emitting elements are located. The display device may further include an encapsulation layer configured to cover the one surface of the base layer on which the first to third color filters are located.

In an embodiment, the first, second and third light-emitting elements may be blue light-emitting elements, the first, second and third color filters may be a blue color filter, a green color filter, and a red color filter, respectively, and the first and second color conversion layers may include green quantum dots and red quantum dots, respectively.

In an embodiment, at least a portion of the first color filter may also be located between the first sub-emission area and the second sub-emission area of each of the first, second, and third pixels so as to overlap the light blocking pattern.

BRIEF DESCRIPTION OF THE DRAWINGS

FIG. 10 is a plan view illustrating a light blocking pattern and a color filter of a display device according to an embodiment of the present disclosure.

DETAILED DESCRIPTION

Figure 1A:
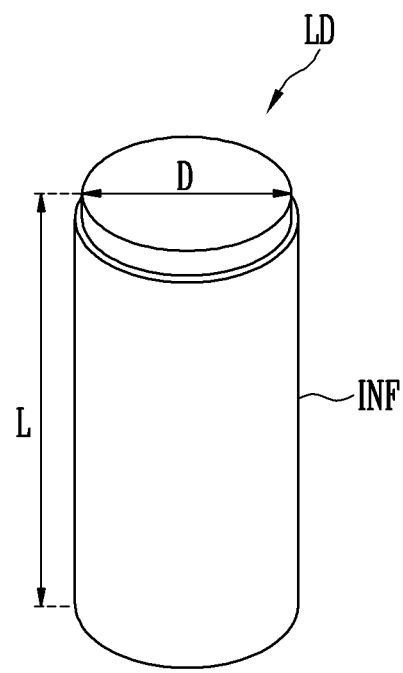
FIG. 1A is a perspective view illustrating a light-emitting element according to an embodiment of the present disclosure.

The present disclosure can be variously modified in various embodiments and example embodiments will be described and shown in the drawings. In the following description, the singular forms "a," "an," and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

On the other hand, the present disclosure is not limited to the following embodiments disclosed herein and may be modified and implemented in various suitable forms. Further, each of the following embodiments may be implemented alone or may be implemented in combination with at least another embodiment.

In the drawings, some components that are not directly related to features of the present disclosure may be omitted in order to clearly illustrate the present disclosure. Some components in the drawings may be shown in exaggerated sizes, ratios, and the like. In the drawings, the same or similar components are denoted by the same reference numerals and signs as possible although they are shown in different drawings, and redundant descriptions thereof will be omitted.

Figure 1B:
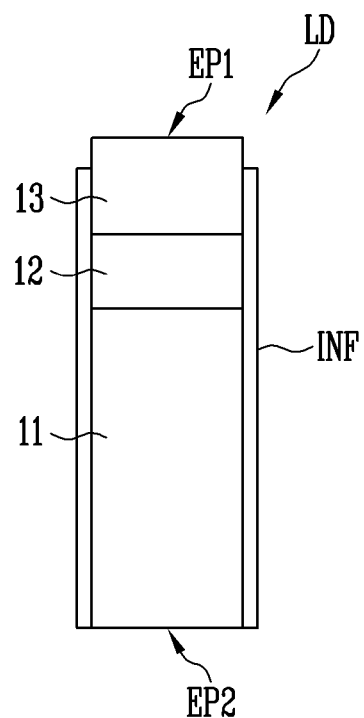
FIGS. 1B-1D are cross-sectional views illustrating different embodiments of a configuration of the light-emitting element of FIG. 1A.
Figure 1C:
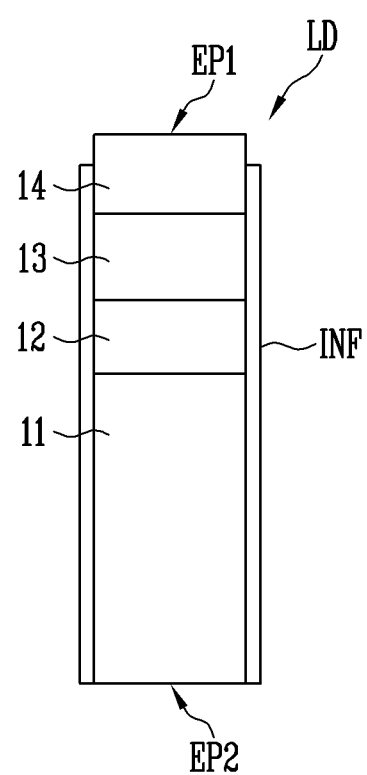
Figure 1D:
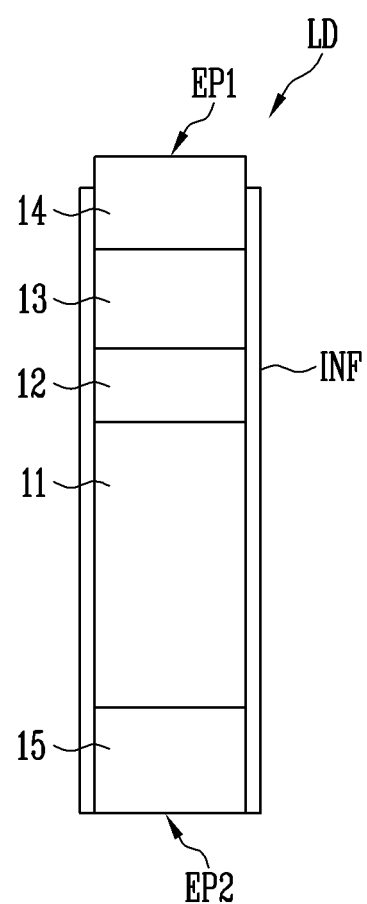

FIG. 1A is a perspective view illustrating a light-emitting element LD according to an embodiment of the present disclosure. FIGS. 1B-1D are cross-sectional views illustrating different embodiments of a configuration of the light-emitting element LD of FIG. 1A. Rod-shaped light-emitting elements LD having a circular columnar shape are illustrated in FIGS. 1A-1D, but the type and/or shape of the light-emitting elements LD according to the present disclosure are not limited thereto.

Referring to FIGS. 1A-1D, the light-emitting element LD includes a first semiconductor layer 11, a second semiconductor layer 13, and an active layer 12 interposed between the first semiconductor layer 11 and the second semiconductor layer 13. As an example, the light-emitting element LD may include the first semiconductor layer 11, the active layer 12, and the second semiconductor layer 13 which are sequentially stacked in a direction of a length L thereof.

The light-emitting element LD may be provided in a rod-like shape extending in one direction. When it is assumed that an extending direction of the light-emitting element LD is the direction of the length L, the light-emitting element LD may have a first end portion EP1 and a second end portion EP2 in the direction of the length L.

One of the first and second semiconductor layers 11 and 13 may be disposed at the first end portion EP1 of the light-emitting element LD. The other one of the first and second semiconductor layers 11 and 13 may be disposed at the second end portion EP2 of the light-emitting element LD. For example, the second semiconductor layer 13 may be disposed at the first end portion EP1 of the light-emitting element LD and the first semiconductor layer 11 may be disposed at the second end portion EP2 of the light-emitting element LD.

According to some embodiments, the light-emitting element LD may be a rod-shaped light-emitting element (also referred to as a "rod-shaped light-emitting diode") manufactured in a rod-like shape through an etching method or the like. In the present disclosure, the term "rod-like shape" includes all of a rod-like shape and a bar-like shape, such as a circular column and a polygonal column, which are long in the direction of the length L (i.e., have an aspect ratio greater than one). A shape of a cross section of the rod-like shape is not particularly limited. For example, the length L1 of the light-emitting element LD may be greater than a diameter D (or width of a cross section) thereof.

The light-emitting element LD may have a small size ranging from a nanometer scale to a micrometer scale. As an example, the light-emitting element LD may have the diameter D (or width) and/or the length L that ranges from a nanometer scale to a micrometer scale. However, the size of the light-emitting element LD is not limited thereto. For example, the size of the light-emitting element LD may be variously changed according to design conditions of various devices, for example, a display device that uses a light-emitting device including the light-emitting element LD as a light source.

The first semiconductor layer 11 may be a first-conductivity type semiconductor layer. For example, the first semiconductor layer 11 may include an N-type semiconductor layer. As an example, the first semiconductor layer 11 may include an N-type semiconductor layer that includes any one semiconductor material selected from InAlGaN, GaN, AlGaN, InGaN, AlN, and InN and is doped with a first-conductivity type dopant such as silicon (Si), germanium (Ge), tin (Sn), or the like. However, a material constituting the first semiconductor layer 11 is not limited thereto, and the first semiconductor layer 11 may be made of various materials.

The active layer 12 may be disposed on the first semiconductor layer 11 and may be formed to have a single-quantum well or multi-quantum well structure. The position of the active layer 12 may be variously changed according to the type of the light-emitting element LD. The active layer 12 may emit light having a wavelength of 400 nm to 900 nm and may have a double hetero-structure.

A clad layer doped with a conductive dopant may be formed on and/or under the active layer 12. As an example, the clad layer may be formed as an AlGaN layer or an InAlGaN layer. According to some embodiments, a material such as AlGaN or AlInGaN may be used to form the active layer 12. Further, the active layer 12 may be made of various materials.

The second semiconductor layer 13 may be disposed on the active layer 12 and may include a semiconductor layer that is a different type from the first semiconductor layer 11. For example, the second semiconductor layer 13 may include a P-type semiconductor layer. As an example, the second semiconductor layer 13 may include a P-type semiconductor layer that includes any one semiconductor material selected from InAlGaN, GaN, AlGaN, InGaN, AlN, and InN and is doped with a second-conductivity type dopant such as magnesium (Mg). However, a material constituting the second semiconductor layer 13 is not limited thereto, and the second semiconductor layer 13 may be made of various materials.

As an example, the first semiconductor layer 11 and the second semiconductor layer 13 may have different lengths (or thicknesses) in the direction of the length L of the light-emitting element LD. As an example, the first semiconductor layer 11 may have a length (or thickness) that is relatively greater than that of the second semiconductor layer 13 in the direction of the length L of the light-emitting element LD. Accordingly, the active layer 12 of the light-emitting element LD may be positioned closer to the first end portion EP1 at the exposed end of the second semiconductor layer 13 than to the second end portion EP2 at the exposed end of the first semiconductor layer 11.

When a voltage greater than equal to a threshold voltage is applied between both end portions of the light-emitting element LD, electrons and holes are combined with each other in the active layer 12, and thus, the light-emitting elements LD emits light. By controlling light emission of the light-emitting element LD using such a principle, the light-emitting element LD may be used as a light source of various light-emitting devices including pixels of a display device.

In an embodiment, the light-emitting element LD may further include additional components in addition to the first semiconductor layer 11, the active layer 12, the second semiconductor layer 13, and/or an insulating film INF surrounding (e.g., surrounding outer peripheral surfaces of) the first semiconductor layer 11, the active layer 12, and the second semiconductor layer 13. For example, the light-emitting element LD may additionally include at least one fluorescent layer, active layer, semiconductor layer, and/or electrode layer disposed at one end sides of the first semiconductor layer 11, the active layer 12, and/or the second semiconductor layer 13.

For example, as illustrated in FIG. 1C, the light-emitting element LD may further include an electrode layer 14 disposed at one end side of the second semiconductor layer 13. In this case, the electrode layer 14 may be positioned at the first end portion EP1 of the light-emitting element LD.

Further, as illustrated in FIG. 1D, the light-emitting element LD may also include another electrode layer 15 disposed at one end side of the first semiconductor layer 11. As an example, the electrode layers 14 and 15 may be disposed at the first and second end portions EP1 and EP2 of the light-emitting element LD, respectively.

The electrode layers 14 and 15 may be ohmic contact electrodes but are not limited thereto. For example, the electrode layers 14 and 15 may be Schottky contact electrodes.

Further, the electrode layers 14 and 15 may include a metal or a metal oxide. For example, the first and second electrode layers 14 and 15 may be made of at least one selected from chromium (Cr), titanium (Ti), aluminum (Al), gold (Au), nickel (Ni), an oxide or alloy thereof, and indium tin oxide (ITO), or a mixture thereof. Materials included in the electrode layers 14 and 15 may be the same or different.

The electrode layers 14 and 15 may be substantially transparent or semi-transparent. Accordingly, light generated in the light-emitting element LD may pass through the electrode layers 14 and 15 and may be emitted to the outside of the light-emitting element LD. In another embodiment, when the light generated in the light-emitting element LD does not pass through the electrode layers 14 and 15 and is emitted to the outside of the light-emitting element LD through an area excluding both end portions of the light-emitting element LD, the electrode layers 14 and 15 may include an opaque metal.

In an embodiment, the light-emitting element LD may further include the insulating film INF provided on a surface thereof (e.g., an outer peripheral surface of the light-emitting element LD). The insulating film INF may be formed on the surface of the light-emitting element LD so as to surround an outer peripheral surface (e.g., an outer circumferential surface) of the active layer 12 at least and may also surround one area (e.g., an outer peripheral surface) of the first and second semiconductor layers 11 and 13.

When the light-emitting element LD includes the electrode layers 14 and 15, the insulating film INF may or may not partially cover outer peripheral surfaces of the electrode layers 14 and 15 at least. That is, the insulating film INF may be selectively formed on surfaces of the electrode layers 14 and 15.

The insulating film INF may expose both end portions EP1 and EP2 of the light-emitting element LD in the direction of the length L of the light-emitting element LD. For example, the insulating film INF may expose at least one of the first and second semiconductor layers 11 and 13 and the electrode layers 14 and 15 at the first and second end portions EP1 and EP2 of the light-emitting element LD. Alternatively, in another embodiment, the insulating film INF may not be provided in the light-emitting element LD.

When the insulating film INF is provided to cover the surface of the light-emitting element LD, for example, the outer peripheral surface of the active layer 12, it is possible to prevent or protect the active layer 12 from being short-circuited with at least one electrode or the like (for example, a first pixel electrode or a second pixel electrode). Accordingly, electrical stability of the light-emitting element LD may be secured. In describing each embodiment of the present disclosure, the term "connection (or coupling)" may comprehensively refer to a physical and/or electrical connection (or coupling). Further, the term "connection (or coupling)" may comprehensively refer to a direct or indirect connection (or coupling) and an integral or non-integral connection (or coupling).

The insulating film INF may include a transparent insulating material. For example, the insulating film INF may include at least one insulating material selected from $SiO_2$ or silicon oxide ($SiO_x$) not determined as $SiO_2$, $Si_3N_4$ or silicon nitride ($SiN_x$) not determined as $Si_3N_4$, silicon nitride ($Si_xN_y$), $Al_2O_3$ or aluminum oxide ($Al_xO_y$) not determined as $Al_2O_3$, and $TiO_2$ or titanium oxide ($Ti_xO_y$) not determined as $TiO_2$, but the present disclosure is not limited thereto. That is, the structural material of the insulating film INF is not particularly limited, and the insulating film INF may be made of various insulating materials.

When the insulating film INF is provided on the surface of the light-emitting element LD, surface defects of the light-emitting element LD may be reduced or minimized, thereby improving a lifetime and efficiency of the light-emitting element LD. Further, when the insulating film INF is formed on each light-emitting element LD, it is possible to prevent an undesired short circuit between adjacent light-emitting elements LD even when the plurality of light-emitting elements LD are closely disposed.

In an embodiment of the present disclosure, the light-emitting element LD may be manufactured through a surface treatment process. For example, when the plurality of light-emitting elements LD are mixed in a flowable solution (or solvent) and supplied to each emission area (for example, an emission area of each pixel), the light-emitting elements LD may each be surface-treated so as to be uniformly dispersed without being non-uniformly aggregated in the solution. As a non-limiting embodiment related thereto, the insulating film INF itself may be formed as a hydrophobic film using a hydrophobic material, or a hydrophobic film made of a hydrophobic material may be additionally formed on the insulating film INF.

A light-emitting device including the light-emitting element LD may be used in various types of devices, such as a display device, that require a light source For example, the plurality of light-emitting elements LD may be disposed in each pixel of a display panel, and the light-emitting elements LD may be used as a light source of each pixel. However, an application field of the light-emitting element LD is not limited to the above-described example. For example, the light-emitting element LD may be used in other types of devices, such as a lighting device, that require a light source.

Figure 2A:
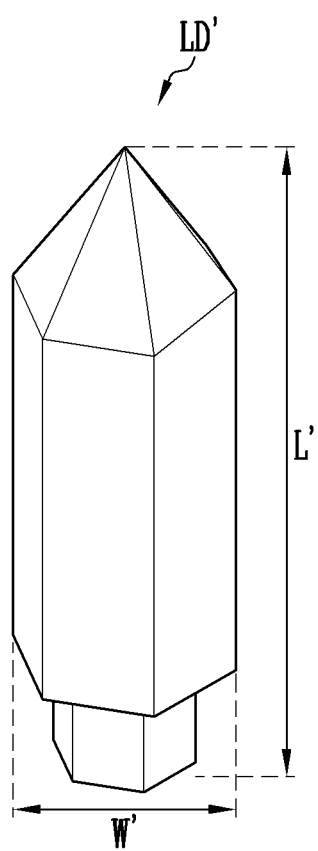
FIG. 2A is a perspective view illustrating a light-emitting element according to an embodiment of the present disclosure.
Figure 2B:
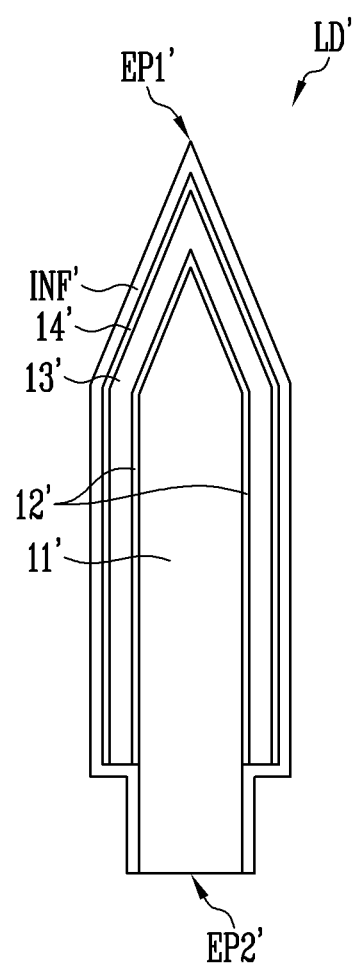
FIG. 2B is a cross-sectional view illustrating the light-emitting element of FIG. 2A.

FIG. 2A is a perspective view illustrating a light-emitting element LD' according to an embodiment of the present disclosure. FIG. 2B is a cross-sectional view illustrating the light-emitting element LD' of FIG. 2A.

According to some embodiments, FIGS. 2A and 2B illustrate the light-emitting element LD' having a structure different from that of the light-emitting elements LD illustrated in FIGS. 1A-1D, for example, a light-emitting element having a core-shell structure. That is, in the present disclosure, the type, structure, and/or shape of the light-emitting element LD/LD' may be variously changed. In the embodiment of FIGS. 2A and 2B, components similar or identical to those of the embodiments of FIGS. 1A-1D (for example, corresponding components) may be denoted by similar reference numerals, and detailed descriptions thereof may be omitted.

Referring to FIGS. 2A and 2B, the light-emitting element LD' may include a first semiconductor layer 11', a second semiconductor layer 13', and an active layer 12' interposed between the first semiconductor layer 11' and the second semiconductor layer 13'. According to some embodiments, the first semiconductor layer 11' may be disposed in a central area of the light-emitting element LD', and the active layer 12' may be disposed on a surface (e.g., an outer peripheral surface) of the first semiconductor layer 11' so as to cover at least one area of the first semiconductor layer 11'. The second semiconductor layer 13' may be disposed on a surface (e.g., an outer peripheral surface) of the active layer 12' so as to surround at least one area of the active layer 12'.

In some embodiments, the light-emitting element LD' may further selectively include an electrode layer 14' surrounding at least one area (e.g., an outer peripheral surface) of the second semiconductor layer 13' and/or an insulating film INF' may be disposed on an outermost surface (e.g., an outer peripheral surface) of the light-emitting element LD'. For example, the light-emitting element LD' may further include the electrode layer 14' disposed on a surface (e.g., an outer peripheral surface) of the second semiconductor layer 13' so as to surround at least one area (e.g., an outer peripheral surface) of the second semiconductor layer 13' and the insulating film INF' may be disposed on a surface (e.g., an outer peripheral surface) of the electrode layer 14' so as to surround at least one area of the electrode layer 14'.

According to some embodiments, the insulating film INF' may be provided on the surface (e.g., an outer peripheral surface) of the light-emitting element LD' to cover a portion of an outer peripheral surface of the first semiconductor layer 11' and an outer peripheral surface of the electrode layer 14'. In an embodiment, after the insulating film INF' is first formed to cover the entire outer peripheral surface of the electrode layer 14' included in the light-emitting element LD', the insulating film INF' may be partially removed to expose one area of the electrode layer 14' in order for the electrode layer 14' to be electrically connected to an electrode (for example, a first pixel electrode). The insulating film INF' may include a transparent insulating material.

The light-emitting element LD' according to the above-described embodiment may be a light-emitting element having a core-shell structure (also referred to as a "core-shell light-emitting diode") manufactured through a growth method or the like. For example, the light-emitting element LD' may have a core-shell structure including the first semiconductor layer 11', the active layer 12', the second semiconductor layer 13', the electrode layer 14', and the insulating film INF' that are sequentially disposed outward from a center thereof. According to some embodiments, the light-emitting element LD' may not include at least one of the electrode layer 14' and the insulating film INF'.

In an embodiment, the light-emitting element LD' may have a polygonal cone shape extending in any one direction. As an example, at least one area of the light-emitting element LD' may have a hexagonal cone shape. However, the shape of the light-emitting element LD' may be variously changed according to embodiments.

When it is assumed that an extending direction of the light-emitting element LD' is a direction of a length L', the light-emitting element LD' may have a first end portion EP1' and a second end portion EP2' in the direction of the length L'. One of the first and second semiconductor layers 11' and 13' (or electrode layer surrounding one of the first and second semiconductor layers 11' and 13') may be disposed at the first end portion EP1' of the light-emitting element LD', and the other one of the first and second semiconductor layers 11' and 13' (or electrode layer surrounding the other one of the first and second semiconductor layers 11' and 13') may be disposed at the second end portion EP2 of the light-emitting element LD'.

In an embodiment, the light-emitting element LD' may be a light-emitting diode having a micro-size and a core-shell structure in which the first end portion EP1' protrudes in a polygonal cone shape (for example, a hexagonal cone shape). As an example, the light-emitting element LD' may have a shape in which a hexagonal cone and a hexagonal column are combined and may have a small size ranging from a nanometer scale to a micrometer scale, for example, a width W and/or the length L' that are in a range of a nanometer scale or a micrometer scale. That is, the size, shape, and the like of the light-emitting element LD' may be variously changed according to design conditions of various devices, for example, a display device that uses the light-emitting element LD' as a light source.

In an embodiment, both end portions of the first semiconductor layer 11' may have shapes protruding in the direction of the length L' of the light-emitting element LD'. The protruding shapes of both end portions of the first semiconductor layer 11' may be different. As an example, among both end portions of the first semiconductor layer 11', one end portion disposed at an upper side may have a cone shape (for example, a hexagonal cone shape) that converges to one vertex while a width thereof is gradually decreased toward an upper portion thereof. Further, among both end portions of the first semiconductor layer 11', the other end portion disposed at a lower side may have a polygonal column shape (for example, a hexagonal column shape) having a suitable width (e.g., a set or predetermined width), but the present disclosure is not limited thereto. For example, in another embodiment of the present disclosure, the first semiconductor layer 11' may have a cross section having a polygonal shape or a step shape in which a width thereof is gradually decreased toward a lower portion thereof. The shapes of both end portions of the first semiconductor layer 11' may be variously changed according to embodiments.

The first semiconductor layer 11' may be positioned at a core, that is, a center (or central area) of the light-emitting element LD'. Further, the light-emitting element LD' may be provided in a shape corresponding to the shape of the first semiconductor layer 11'. As an example, when the first semiconductor layer 11' has a hexagonal cone shape at one end portion at an upper side, the light-emitting element LD' may have a hexagonal cone shape at one end portion at an upper side (for example, the first end portion EP1').

The active layer 12' may be provided and/or formed to surround an outer peripheral surface of the first semiconductor layer 11'. For example, the active layer 12' may be provided and/or formed in a form that surrounds the remaining area excluding one end portion (for example, one end portion at a lower side) of the first semiconductor layer 11' in the direction of the length L' of the light-emitting element LD'.

The second semiconductor layer 13' may be provided and/or formed to surround an outer peripheral surface of the active layer 12' and may include a semiconductor layer that is a different type from the first semiconductor layer 11'. As an example, when the first semiconductor layer 11' includes an N-type semiconductor layer, the second semiconductor layer 13' may include a P-type semiconductor layer.

In an embodiment, the light-emitting element LD' may further include an electrode layer 14' surrounding an outer peripheral surface of the second semiconductor layer 13'. The electrode layer 14' may be an ohmic contact electrode or a Schottky contact electrode electrically connected to the second semiconductor layer 13' but is not limited thereto.

As described above, the light-emitting element LD' may be formed in a core-shell structure of which both end portions have protruding shapes and may include the first semiconductor layer 11' provided at the center thereof, the active layer 12' surrounding the first semiconductor layer 11', and the second semiconductor layer 13' surrounding the active layer 12'. Further, the light-emitting element LD' may selectively include the electrode layer 14' surrounding the second semiconductor layer 13'. One end portion of the electrode layer 14' may be disposed at the first end portion EP1' of the light-emitting element LD', and one end portion of the first semiconductor layer 11' may be disposed at the second end portion EP2' of the light-emitting element LD'.

The light-emitting element LD/LD' may be used in various types of devices, such as a display device, that require a light source. For example, one or more light-emitting elements LD/LD' may be disposed in each pixel area of a display panel and used as a light source.

In an embodiment, each pixel may include one or more rod-shaped light-emitting elements LD, one or more light-emitting element LD' having a core-shell structure, or a combination of the rod-shaped light-emitting element LD and the light-emitting element LD' having a core-shell structure. In another embodiment, each pixel may include other light-emitting element having a different type and/or shape from the rod-shaped light-emitting element LD or the light-emitting element LD' having a core-shell structure. For convenience, the light-emitting elements may be designated as LD throughout the present disclosure when describing some embodiments. However, any suitable light-emitting elements LD/LD' may be used. For example, any light-emitting elements LD/LD' of various embodiments illustrated in and/or described in reference to FIGS. 1-6 may be applied to any display device or lighting device according to embodiments of the present disclosure as light-emitting elements, either individually or in any suitable combination.

Figure 3:
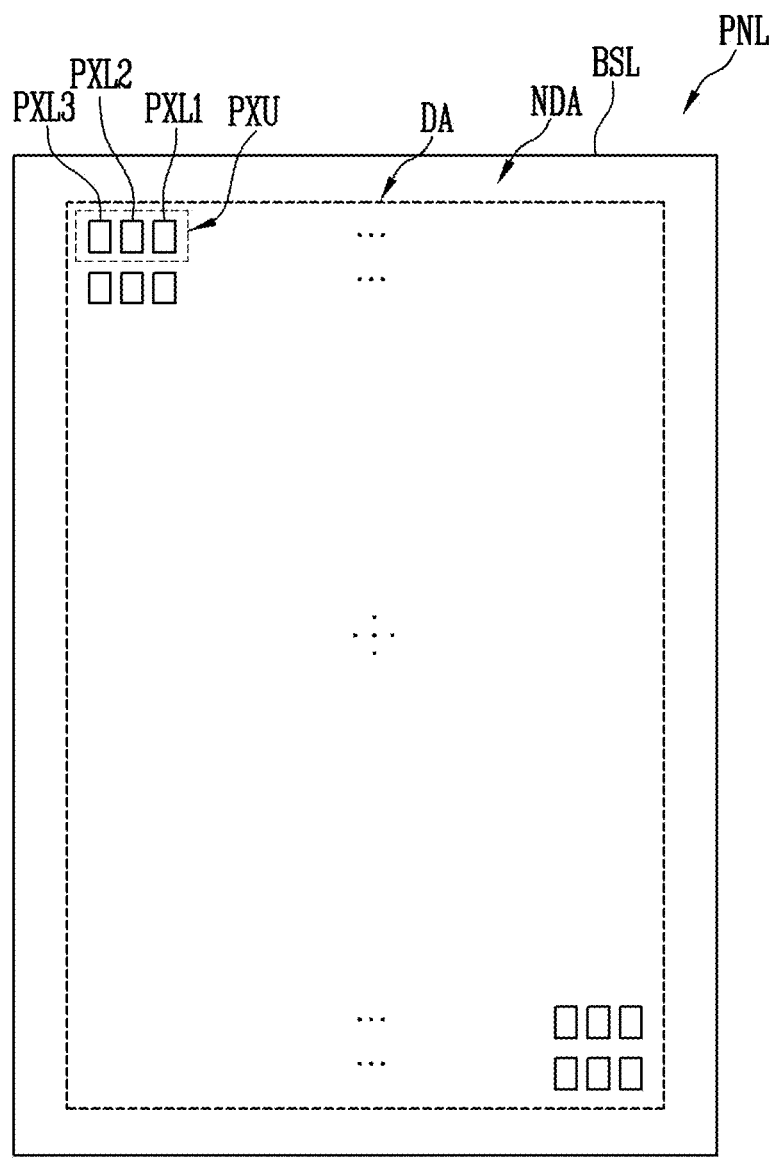
FIG. 3 is a plan view illustrating a display device according to an embodiment of the present disclosure.

FIG. 3 is a plan view illustrating a display device according to an embodiment of the present disclosure. As an example of an electronic device that may use the light-emitting elements LD/LD' described in the embodiments of FIGS. 1A-2B as a light source, a display device, for example, a display panel PNL included in the display device, is illustrated in FIG. 3. As an example, each pixel unit PXU of the display panel PNL and each pixel constituting the same may include one or more light-emitting elements LD/LD'.

For convenience, the structure of the display panel PNL is briefly illustrated in FIG. 3 based on a display area DA. However, according to some embodiments, at least one driving circuit unit (for example, at least one of a scan driver and a data driver), lines, and pads may be further disposed in the display panel PNL.

Referring to FIG. 3, the display panel PNL according to an embodiment of the present disclosure may include a base layer BSL and pixels disposed on the base layer BSL. The pixels may include first pixels PXL1, second pixels PXL2, and/or third pixels PXL3. In describing embodiments of the present disclosure, when at least one pixel of the first pixels PXL1, the second pixels PXL2, and the third pixels PXL3 is arbitrarily described, the pixel refers to "pixel PXL," or when at least two pixels thereof are collectively described, the pixels refer to "pixels PXL."

For example, the display panel PNL and the base layer BSL for forming the display panel PNL may include the display area DA for displaying an image and a non-display area NDA other than the display area DA. For example, the non-display area NDA may surround the display area DA along the edge or periphery of the display area DA. The pixels PXL may be disposed in the display area DA on the base layer BSL.

The display area DA may be disposed in a central area of the display panel PNL, and the non-display area NDA may be disposed in an edge area of the display panel PNL so as to surround the display area DA. However, the positions of the display area DA and the non-display area NDA are not limited thereto and may be changed. The display area DA may constitute a screen on which an image is displayed, and the non-display area NDA may be an area other than the display area DA.

The base layer BSL may constitute a base member of the display panel PNL and may be a rigid or flexible substrate or film. As an example, the base layer BSL may be a rigid substrate made of glass or tempered glass, a flexible substrate (or thin film) made of plastic or metal, or at least one layer of an insulating film. The material and/or physical properties of the base layer BSL are not particularly limited.

In an embodiment, the base layer BSL may be substantially transparent. Here, the term "substantially transparent" may mean that light can be transmitted at a suitable transmittance (e.g., a set or predetermined transmittance) or more. In another embodiment, the base layer (BSL) may be semi-transparent or opaque. In some embodiments, the base layer BSL may include a reflective material.

One area of the base layer BSL may be defined as the display area DA, and thus, the pixels PXL are disposed therein. The remaining area of the base layer BSL may be defined as the non-display area NDA. As an example, the base layer BSL may include the display area DA including a plurality of pixel areas, in which the pixels PXL are formed, and the non-display area NDA disposed outside the display area DA surrounding the display area DA along the edge or periphery of the display area DA. Various lines, pads, and/or an embedded circuit unit connected to the pixels PXL of the display area DA may be disposed in the non-display area NDA.

The pixels PXL may be arranged in the display area DA. As an example, the pixels PXL may be regularly arranged in the display area DA according to a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PXL is not limited thereto, and the pixels PXL may be arranged in the display area DA in various structures and/or manners.

According to some embodiments, two or more types of pixels PXL emitting light having different colors may be disposed in the display area DA. As an example, the first pixels PXL1 emitting first color light, the second pixels PXL2 emitting second color light, and the third pixels PXL3 emitting third color light may be arranged in the display area DA. At least one first pixel PXL1, at least one second pixel PXL2, and at least one third pixel PXL3 disposed adjacent to each other may constitute one pixel unit PXU capable of emitting light having various colors. For example, the first pixel PXL1, the second pixel PXL2, and the third pixel PXL3 may be subpixels, and each subpixel emits light having a suitable color (e.g., a set or predetermined color). According to some embodiments, the first pixel PXL1 may be a blue pixel that emits blue light, the second pixel PXL2 may be a green pixel that emits green light, and the third pixel PXL3 may be a red pixel that emits red light, but the present disclosure is not limited thereto.

In an embodiment, the first pixel PXL1, the second pixel PXL2, and the third pixel PXL3 may respectively include a first color light-emitting element, a second color light-emitting element, and a third color light-emitting element as a light source to respectively emit first color light, second color light, and third color light. In another embodiment, the first pixel PXL1, the second pixel PXL2, and the third pixel PXL3 may include light-emitting elements that emit the same color light. Further, the first pixel PXL1, the second pixel PXL2, and the third pixel PXL3 may include color conversion layers and/or color filters having different colors, which are disposed on the light-emitting elements, thereby respectively emitting first color light, second color light, and third color light.

However, the color, type, and/or number of the pixels PXL constituting each pixel unit PXU are not particularly limited. As an example, the color of light emitted by each pixel PXL may be variously changed.

The pixel PXL may include at least one light source driven by control signals (e.g., set or predetermined control signals) (for example, a scan signal and a data signal) and/or power sources (e.g., set or predetermined power sources) (for example, a first power source and a second power source). In an embodiment, the light source may include one or more light-emitting elements LD according to an embodiment of the embodiments of FIGS. 1A-1D, for example, one or more micro rod-shaped light-emitting elements LD having a small size ranging from a nanometer scale to a micrometer scale, and/or one or more light-emitting elements LD' according to the embodiment of FIGS. 2A and 2B, for example, one or more micro core-shell structure light-emitting elements LD' having a small size ranging from a nanometer scale to a micrometer scale. Further, various types of the light-emitting elements LD/LD' may be used as the light source of the pixel PXL.

Further, each pixel PXL may have a structure according to at least one of various embodiments to be described below. For example, each pixel PXL may have a structure of any one of embodiments illustrated in FIGS. 4-9B or may have a structure in which at least two of the embodiments are coupled.

In an embodiment, each pixel PXL may be formed as an active pixel. However, the type, structure, and/or driving method of the pixels PXL applicable to a display device of the present disclosure are not particularly limited. For example, each pixel PXL may be formed as a pixel of a passive or active light-emitting display device having various structures and/or driving methods.

Figure 4:
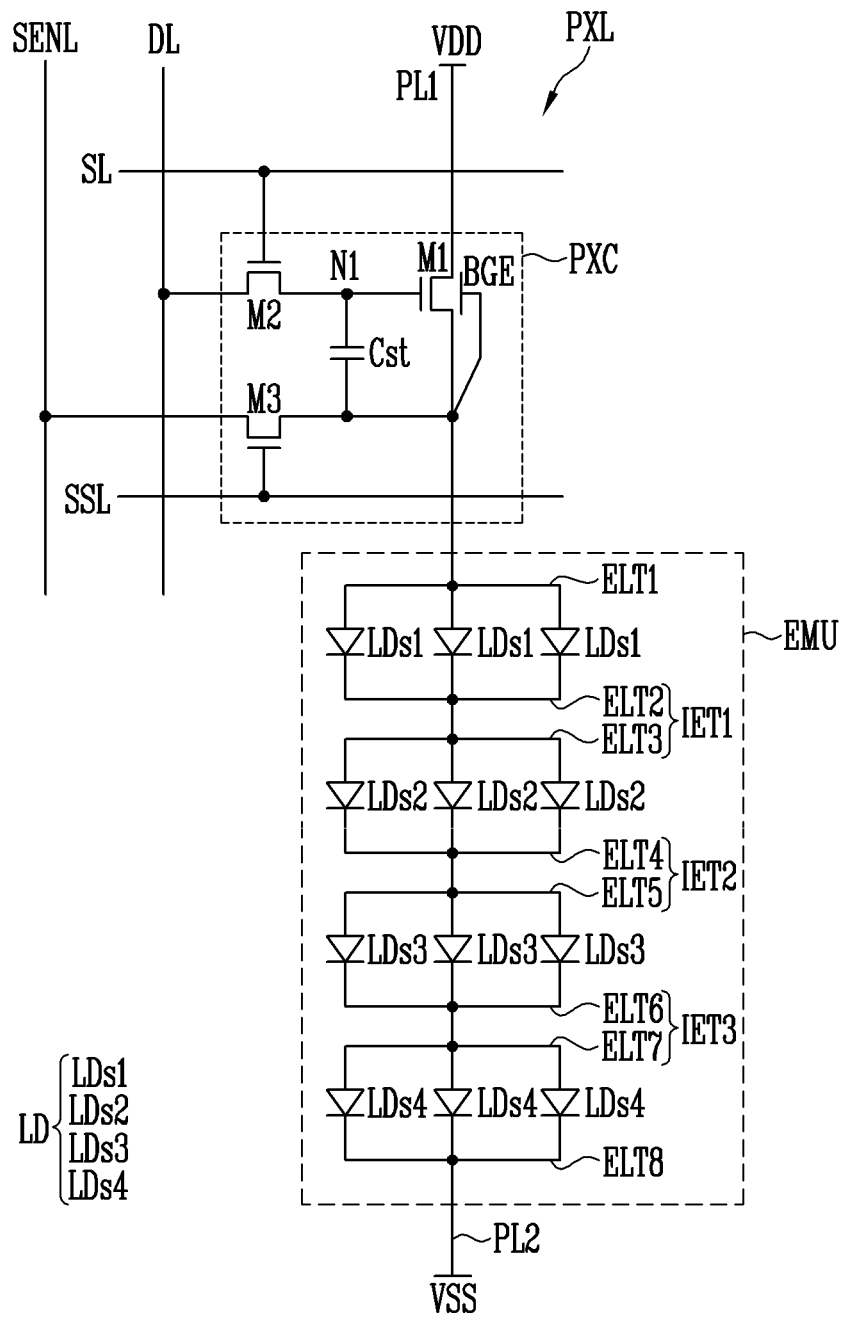
FIG. 4 is a circuit diagram illustrating a pixel according to an embodiment of the present disclosure.

FIG. 4 is a circuit diagram illustrating a pixel PXL according to an embodiment of the present disclosure. For example, FIG. 4 illustrates an embodiment of the pixel PXL that is applicable to an active display device. However, the types of the pixel PXL and a display device to which the embodiment of the present disclosure is applicable are not limited thereto.

According to some embodiments, the pixel PXL illustrated in FIG. 4 may be any one of the first pixel PXL1, the second pixel PXL2, and the third pixel PXL3 provided in the display panel PNL of FIG. 3. Further, the first pixel PXL1, the second pixel PXL2, and the third pixel PXL3 may have substantially the same or similar structure.

Referring to FIG. 4, the pixel PXL may include a light-emitting unit EMU for generating light having luminance corresponding to a data signal. The pixel PXL may further include a pixel circuit PXC for driving the light-emitting unit EMU.

The light-emitting unit EMU may include one or more light-emitting elements LD connected between a first power source VDD and a second power source VSS, for example, the plurality of light-emitting elements LD. First end portions (for example, P-type end portions) of the light-emitting elements LD may be electrically connected to the first power source VDD through the pixel circuit PXC, a first power line PL1, and the like, and/or second end portions (for example, N-type end portions) of the light-emitting elements LD may be electrically connected to the second power source VSS through a second power line PL2 and the like.

According to some embodiments, the light-emitting elements LD may be electrically connected to each other through various connection structures between the first power source VDD and the second power source VSS. As an example, the light-emitting elements LD may be connected only in parallel or only in series. Accordingly, the light-emitting elements LD may be connected in a series-parallel combination structure.

For example, as illustrated in FIG. 4, the light-emitting elements LD may be divided into four series stages and connected in series and parallel. In this case, each series stage may include one pair of electrodes (for example, two electrodes) and one or more light-emitting element LD electrically connected between the one pair of electrodes. Here, the numbers of the light-emitting elements LD constituting the series stages may be the same or different, and the number of the light-emitting elements LD is not particularly limited.

For example, a first series stage may include a first electrode ELT1, a second electrode ELT2, and one or more light-emitting electrodes LDs1 connected between the first electrode ELT1 and the second electrode ELT2, and a second series stage may include a third electrode ELT3, a fourth electrode ELT4, and one or more second light-emitting elements LDs2 connected between the third electrode ELT3 and the fourth electrode ELT4. Similarly, a third series stage may include a fifth electrode ELT5, a sixth electrode ELT6, and one or more third light-emitting elements LDs3 connected between the fifth electrode ELT5 and the sixth electrode ELT6, and a fourth series stage may include a seventh electrode ELT7, an eighth electrode ELT8, and one or more fourth light-emitting elements LDs4 connected between the seventh electrode ELT7 and the eighth electrode ELT8.

A first electrode of the light-emitting unit EMU, for example, the first electrode ELT1, may be a first pixel electrode (or anode) of the light-emitting unit EMU. A last electrode of the light-emitting unit EMU, for example, the eighth electrode ELT8, may be a second pixel electrode (or cathode) of the light-emitting unit EMU.

The remaining electrodes of the light-emitting unit EMU, for example, the second to seventh electrodes ELT2 to ELT7, may each constitute an intermediate electrode. For example, the second and third electrodes ELT2 and ELT3 may be integrally or non-integrally connected to each other to form a first intermediate electrode IET1. Similarly, the fourth electrode ELT4 and the fifth electrode ELT5 may be integrally or non-integrally connected to each other to form a second intermediate electrode IET2, and the sixth electrode ELT6 and the seventh electrode ELT7 may be integrally or non-integrally connected to each other to form a third intermediate electrode IET3. In this case, the second and third electrodes ELT2 and ELT3 may be integrated to be regarded as one first intermediate electrode IET1, the fourth and fifth electrodes ELT4 and ELT5 may be integrated to be regarded as one second intermediate electrode IET2, and the sixth and seventh electrodes ELT6 and ELT7 may be integrated to be regarded as one third intermediate electrode IET3.

While FIG. 4 illustrates an embodiment in which the light-emitting elements LD are connected in a four-stage series-parallel combination structure, the present disclosure is not limited thereto. For example, in another embodiment, at least two light-emitting elements LD may be connected in a two-stage series or series-parallel combination structure, or four or more light-emitting elements LDs may be connected in a series or series-parallel combination structure with four or more stages.

Assuming that the light-emitting unit EMU is formed using the light-emitting elements LD under the same conditions (for example, the same size and/or number) as an effective light source, when the light-emitting elements LD are connected in a series or series-parallel structure, power efficiency may be improved. For example, in the light-emitting unit EMU in which the light-emitting elements LD are connected in series or in series-parallel, higher luminance may be expressed with the same current as compared with a light-emitting unit in which the light-emitting elements LD are connected only in parallel. Further, in the light-emitting unit EMU in which the light-emitting elements LD are connected in series or in series-parallel, the same luminance may be expressed (or realized) with a lower driving current as compared with a light-emitting unit in which the light-emitting elements LD are connected in parallel.

Furthermore, in the pixel PXL in which the light-emitting elements LD are connected in a series or series-parallel combination structure, even when short circuit defects occur in some series stages, a certain degree of luminance may be expressed through the light-emitting elements LD of the remaining series stage, thereby reducing the possibility of dark spot defects of the pixel PXL.

While FIG. 4 illustrates an embodiment in which the light-emitting elements LD are connected in a series-parallel combination structure, the present disclosure is not limited thereto. For example, in another embodiment, the light-emitting elements LD constituting the light-emitting unit EMU of each pixel PXL may be connected only in series or only in parallel.

Each of the light-emitting elements LD may include the first end portion (for example, the P-type end portion) connected to the first power source VDD through the first pixel electrode (for example, the first electrode ELT1), the pixel circuit PXC, the first power line PL1, and/or the like, and the second end portion (for example, the N-type end portion) connected to the second power source VSS through the second pixel electrode (for example, the eighth electrode ELT8), the second power line PL2, and the like. That is, the light-emitting elements LD may be connected in a forward direction between the first power source VDD and the second power source VSS. As described above, each of the light-emitting elements LD connected in the forward direction between the first power source VDD and the second power source VSS may constitute each effective light source. The effective light sources may be clustered to constitute the light-emitting unit EMU of the pixel PXL.

The first power source VDD and the second power source VSS may have different potentials such that the light-emitting elements LD emit light. As an example, the first power source VDD may be set as a high potential power source, and the second power source VSS may be set as a low potential power source. In this case, the first power source VDD and the second power source VSS may have a potential difference such that the light-emitting elements LD emit light during an emission period of the pixel PXL.

When a driving current is supplied through the corresponding pixel circuit PXC, the light-emitting elements LD may emit light with luminance corresponding to the driving current. For example, during each frame period, the pixel circuit PXC may supply a driving current corresponding to a gradation value expressed in a corresponding frame to the light-emitting unit EMU. Accordingly, while the light-emitting element LD emit light with luminance corresponding to a driving current, the light-emitting unit EMU may emit light with luminance corresponding to the driving current.

In an embodiment, the light-emitting unit EMU may further include at least one ineffective light source in addition to the light-emitting elements LD each constituting the effective light source. As an example, at least one ineffective light-emitting element, which is arranged in a reverse direction, or of which at least one end portion is enabled, may be further connected to at least one series stage. Even when a driving voltage (e.g., a set or predetermined driving voltage) (for example, a forward driving voltage) is applied between the first pixel electrode and the second pixel electrode, the ineffective light-emitting element may maintain an inactive state and thus may maintain substantially a non-emission state.

The pixel circuit PXC may be connected between the first power source VDD and the light-emitting unit EMU. The pixel circuit PXC may be connected to a scan line SL and a data line DL of the corresponding pixel PXL. Further, the pixel circuit PXC may be further selectively connected to a sensing signal line SSL and a sensing line SENL.

The pixel circuit PXC may include a first transistor M1, a second transistor M2, a third transistor M3, and a storage capacitor Cst.

The first transistor M1 is connected between the first power source VDD and the first electrode ELT1 of the light-emitting unit EMU. A gate electrode of the first transistor M1 is connected to a first node N1. The first transistor M1 controls a driving current supplied to the light-emitting unit EMU in response to a voltage of the first node N1. That is, the first transistor M1 may be a driving transistor that controls a driving current of the pixel PXL.

Further, the first transistor M1 may selectively include a back gate electrode BGE (or bottom metal layer BML) connected to the first electrode ELT1. The back gate electrode BGE may be disposed to overlap the gate electrode with an insulating layer interposed therebetween.

The second transistor M2 is connected between the data line DL and the first node N1. A gate electrode of the second transistor M2 is connected to the scan line SL. When a scan signal having a gate-on voltage (for example, a high level voltage) is supplied from the scan line SL, the second transistor M2 is turned on to electrically connect the data line DL and the first node N1.

During each frame period, a data signal of a corresponding frame is supplied to the data line DL, and the data signal is transmitted to the first node N1 through the second transistor M2 turned on during a period in which the scan signal having a gate-on voltage is supplied. That is, the second transistor M2 may be a switching transistor for transmitting each data signal into the pixel PXL.

One electrode of the storage capacitor Cst is connected to the first node N1, and the other electrode thereof is connected to the first electrode ELT1 of the light-emitting unit EMU (or a second electrode of the first transistor M1). The storage capacitor Cst is charged with a voltage (or holds a charge) corresponding to a data signal supplied to the first node N1 during each frame period.

The third transistor M3 is connected between the first electrode ELT1 of the light-emitting unit EMU and the sensing line SENL. A gate electrode of the third transistor M3 is connected to the sensing signal line SSL. The third transistor M3 may transmit a voltage value applied to the first electrode ELT1 of the light-emitting unit EMU (or voltage value applied to the anode of the light-emitting element LD) to the sensing line SENL according to a sensing signal supplied to the sensing signal line SSL during a sensing period (e.g., a set or predetermined sensing period). The voltage value transmitted through the sensing line SENL may be provided to an external circuit (for example, a timing controller), and the external circuit may extract characteristic information of each pixel PXL (for example, a threshold voltage and the like of the first transistor M1) based on the supplied voltage value. The extracted characteristic information may be used to convert image data so that a characteristic deviation between the pixels PXL is compensated for.

While in FIG. 4, the transistors included in the pixel circuit PXC, for example, all of the first, second, and third transistors M1, M2, and M3 are illustrated as being N-type transistors, but the present disclosure is not limited thereto. That is, at least one of the first to third transistors T1 to T3 may be changed to a P-type transistor. In another embodiment, the pixel circuit PXC may include P-type and N-type transistors in combination. For example, some of the transistors included in the pixel circuit PXC may be P-type transistors, and the others may be N-type transistors. In this case, a voltage level of control signals (for example, a scan signal, a data signal, and/or a sensing signal) for driving each transistor may be adjusted according to the type of transistors, as one of ordinary skill in the art would appreciate.

Further, the structure and driving method of the pixel PXL may be variously changed according to embodiments. For example, the pixel circuit PXC may be provided as a pixel circuit having various structures and/or driving methods in addition to the embodiment illustrated in FIG. 4.

As an example, the pixel circuit PXC may not include the third transistor M3. Further, the pixel circuit PXC may include other circuit elements such as a transistor for compensating for a threshold voltage of the first transistor M1, a transistor for initializing a voltage of the first node N1 or the first electrode ELT1 of the light-emitting unit EMU, a transistor for controlling a period in which a driving current is supplied to the light-emitting unit EMU, and/or a boosting capacitor for boosting the voltage of the first node N1.

In another embodiment, when each pixel PXL is provided in a passive light-emitting display device or the like, the pixel circuit PXC may be omitted. Each of the first and second pixel electrodes of the light-emitting unit EMU may be connected directly to the scan line SL, the data line DL, the first power line PL1, the second power line PL2, or other signal lines or power lines.

Figure 5:
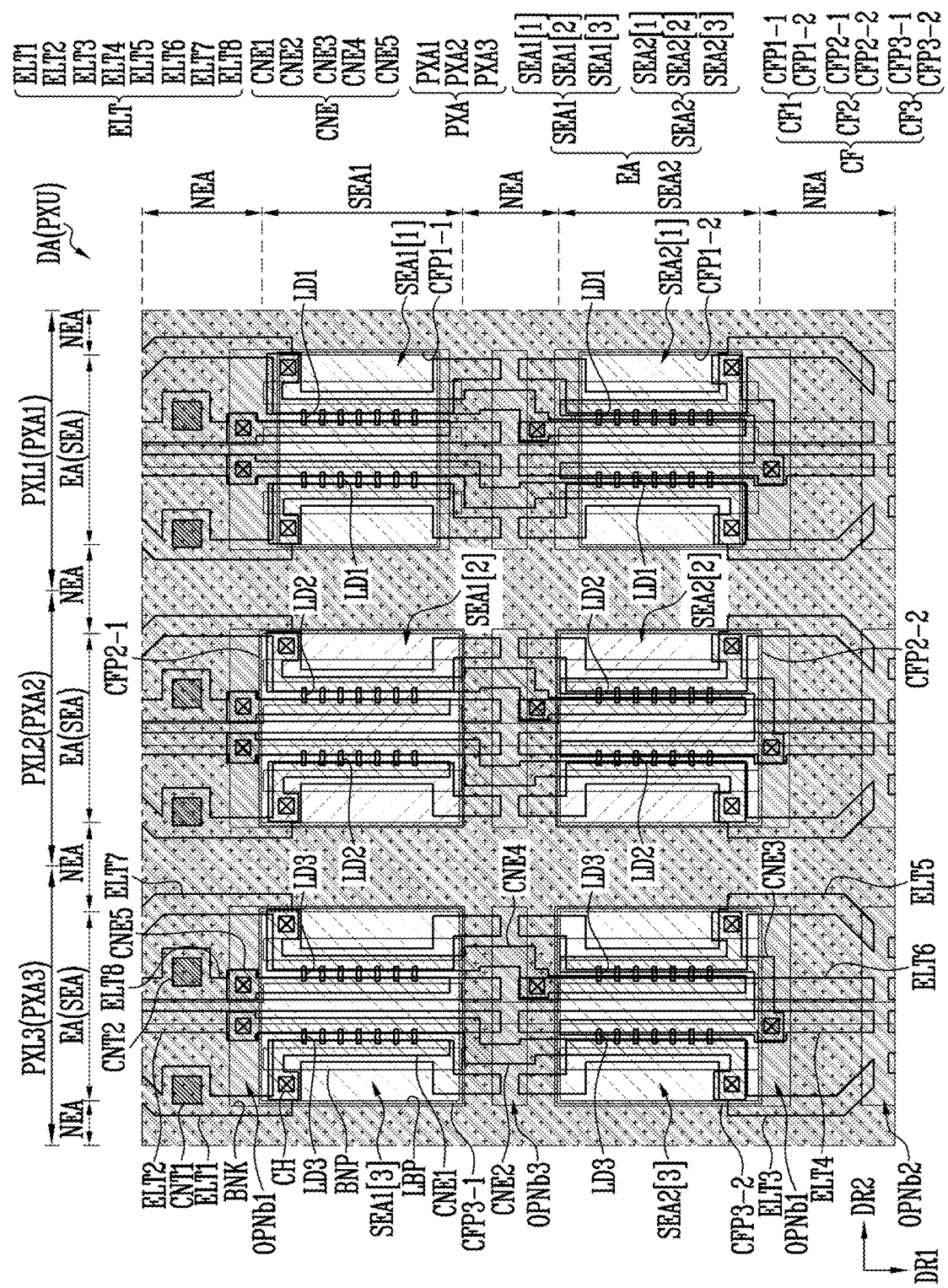
FIGS. 5 and 6 are plan views each illustrating a display area of a display device according to an embodiment of the present disclosure.
Figure 6:
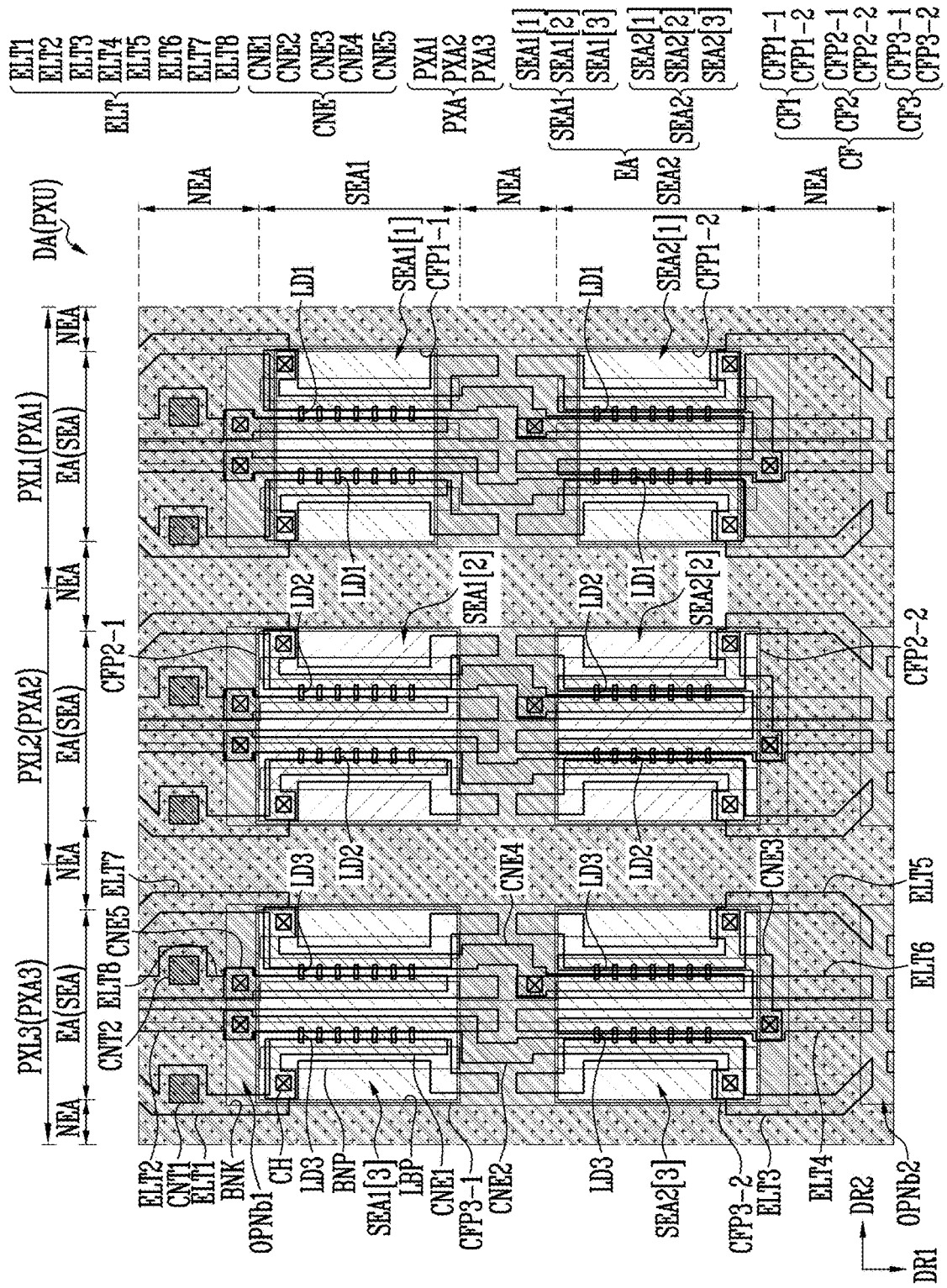

FIGS. 5 and 6 are plan views each illustrating a display area DA of a display device according to an embodiment of the present disclosure. As an example, FIG. 5 illustrates a structure of the display area DA based on first to third pixel areas PXA1, PXA2, and PXA3 that are positioned adjacent to each other in the display area DA and in which first to third pixels PXL1, PXL2, and PXL3 constituting the pixel unit PXU of FIG. 3 are disposed and based on a light blocking pattern LBP and color filters CF that are disposed on the first to third pixels PXL1, PXL2, and PXL3. Further, FIG. 5 illustrates an structure of the first to third pixels PXL1, PXL2, and PXL3 based on a display layer on which a light-emitting unit EMU of each of the first to third pixels PXL1, PXL2, and PXL3 is disposed. FIG. 6 illustrates a modified embodiment of the embodiment of FIG. 5 in relation to a bank BNK.

Referring to FIGS. 3-6, the first to third pixels PXL1, PXL2, and PXL3 may each include a plurality of sub-emission areas spaced from each other in each of the first pixel area PXA1, the second pixel area PXA2, and the third pixel area PXA3. For example, the first to third pixels PXL1, PXL2, and PXL3 may each include a first sub-emission area SEA1 and a second sub-emission area SEA2.

Hereinafter, when at least one sub-emission area of the first sub-emission area SEA1 and the second sub-emission area SEA2 of the first to third pixels PXL1, PXL2, and PXL3 is arbitrarily described, the sub-emission area refers to "sub-emission area SEA," or when the first sub-emission area SEA1 and the second sub-emission area SEA2 are collectively described, the first sub-emission area SEA1 and the second sub-emission area SEA2 refer to "sub-emission areas SEA." Further, when at least one pixel area of the first to third pixel areas PXA1, PXA2, and PXA3 is arbitrarily described, the pixel area refers to "pixel area PXA," or when the first to third pixel areas PXA1, PXA2, and PXA3 are collectively described, the first to third pixel areas PXA1, PXA2, and PXA3 refer to "pixel areas PXA."

The first pixel PXL1 may include a first sub-emission area SEA1[1] and a second sub-emission area SEA2[1] that are spaced from each other in a first direction DR1 in the first pixel area PXA1, and first light-emitting elements LD1 that are divided and disposed in the first and second sub-emission areas SEA1[1] and SEA2[1]. The first light-emitting elements LD1 may be light-emitting elements that emit the same color light. For example, the first light-emitting elements LD1 may be first color light-emitting elements each emitting first color light (for example, blue light).

The second pixel PXL2 may be disposed adjacent to the first pixel PXL1. The second pixel PXL2 may include a first sub-emission area SEA1[2] and a second sub-emission area SEA2[2] that are spaced from each other in the first direction DR1 in the second pixel area PXA2, and second light-emitting elements LD2 that are divided and disposed in the first and second sub-emission areas SEA1[2] and SEA2[2]. The second light-emitting elements LD2 may be light-emitting elements that emit the same color light.

In an embodiment, the second light-emitting elements LD2 may be light-emitting elements that emit the same color light as the first light-emitting elements LD1. For example, the second light-emitting elements LD2 may be the first color light-emitting elements each emitting the first color light (for example, the blue light) like the first light-emitting elements LD1.

In another embodiment, the second light-emitting elements LD2 may be light-emitting elements that emit color light different from that of the first light-emitting elements LD1. For example, the second light-emitting elements LD2 may be second color light-emitting elements that emit second color light (for example, green light) different from the first color light.

The third pixel PXL3 may be disposed adjacent to the first pixel PXL1 and/or the second pixel PXL2. The third pixel PXL3 may include a first sub-emission area SEA1[3] and a second sub-emission area SEA2[3] that are spaced from each other in the first direction DR1 in the third pixel area PXA3, and third light-emitting elements LD3 that are divided and disposed in the first and second sub-emission areas SEA1[3] and SEA2[3]. The third light-emitting elements LD3 may be light-emitting elements that emit the same color light.

In an embodiment, the third light-emitting elements LD3 may be light-emitting elements that emit the same color light as the first and/or second light-emitting elements LD1 and LD2. For example, the third light-emitting elements LD3 may be the first color light-emitting elements each emitting the first color light (for example, the blue light) like the first light-emitting elements LD1.

In an embodiment, the third light-emitting elements LD3 may be light-emitting elements that emit color light different from that of the first and/or second light-emitting elements LD1 and LD2. For example, the third light-emitting elements LD3 may be third color light-emitting elements that emit third color light (for example, red light) different from the first color light and the second color light.

Each of the sub-emission areas SEA of each pixel PXL may include one or more light-emitting elements and electrodes connected thereto (for example, at least two pixel electrodes of first to eighth electrodes ELT1 to ELT8 and/or at least one contact electrode of first to fifth contact electrodes CNE1 to CNE5). For example, the first and second sub-emission areas SEA1[1] and SEA2[1] of the first pixel PXL1 may each include one or more first light-emitting elements LD1 and electrodes connected thereto. Similarly, the first and second sub-emission areas SEA1[2] and SEA2[2] of the second pixel PXL2 may each include one or more second light-emitting elements LD2 and electrodes connected thereto, and the first and second sub-emission areas SEA1[3] and SEA2[3] of the third pixel PXL3 may each include one or more third light-emitting elements LD3 and electrodes connected thereto.

Hereinafter, when at least one light-emitting element of the first to third light-emitting elements LD1, LD2, and LD3 is arbitrarily described, the light-emitting element refers to "light-emitting element LD," or when at least two light-emitting elements thereof are collectively described, the light-emitting elements refer to "light-emitting elements LD." Further, when at least one pixel electrode of pixel electrodes including the first to eighth electrodes ELT1 to ELT8 is arbitrarily described, the pixel electrode refers to "pixel electrode ELT" or "pixel electrodes ELT," and when at least one contact electrode of the contact electrodes including first to fifth contact electrodes CNE1 to CNE5 is arbitrarily described, the contact electrode refers to "contact electrode CNE" or "contact electrodes CNE."

In an embodiment, when each pixel PXL includes the plurality of light-emitting elements LD divided and disposed at a plurality of series stages as in the embodiment illustrated in FIG. 4, each of the first and second sub-emission areas SEA1 and SEA2 may include the light-emitting elements LD disposed in at least one series stage and electrodes connected thereto. For example, the first sub-emission area SEA1 of each pixel PXL may include the plurality of light-emitting elements LD disposed at a first series stage of the corresponding pixel PXL and the plurality of electrodes connected thereto, and the second sub-emission area SEA2 of each pixel PXL may include the plurality of light-emitting elements LD disposed at a second series stage of the corresponding pixel PXL and the plurality of electrodes connected thereto.

In this case, at least one light-emitting element LD disposed in the first sub-emission area SEA1 of each pixel PXL and at least one light-emitting element LD disposed in the second sub-emission area SEA2 of the corresponding pixel PXL may be connected in series. As an example, at least one first light-emitting element LD1 disposed in the first sub-emission area SEA1[1] of the first pixel PXL1 and at least one first light-emitting element LD1 disposed in the second sub-emission area SEA2[1] of the first pixel PXL1 may be connected in series using at least one contact electrode CNE.

Further, when it is assumed that each pixel PXL includes a larger number of series stages than the number of the sub-emission areas SEA of each pixel PXL, at least one sub-emission area SEA may include the light-emitting elements LD disposed at two or more series stages and the electrodes connected thereto. For example, the first sub-emission area SEA1 of each pixel PXL may include the light-emitting elements LD disposed at first and fourth series stages of the light-emitting unit EMU and electrodes, and the second sub-emission area SEA2 of each pixel PXL may include the light-emitting elements LD disposed at second and third series stages of the light-emitting unit EMU and electrodes.

The structure of each pixel PXL will be described in more detail below with reference to FIGS. 7-9B.

The sub-emission areas SEA each including the light-emitting elements LD may constitute an emission area EA of the corresponding pixel PXL. The remaining pixel areas excluding the sub-emission areas SEA (and/or areas between the pixels PXL) may constitute a non-emission area NEA of each pixel PXL (and/or a non-emission area between adjacent pixels PXL). The bank BNK may be disposed in the non-emission area NEA.

The bank BNK may be disposed in the non-emission area NEA to surround the emission area EA including the first and second sub-emission areas SEA1 and
SEA2 of each pixel PXL. The bank BNK may be a structure defining the emission area EA of each pixel PXL and may be, for example, a pixel definition film. For example, the bank BNK may be disposed in a peripheral area of each pixel area PXA in which the pixel PXL is provided and/or in a boundary area between adjacent pixel areas PXA to surround the emission area EA of each pixel PXL.

The bank BNK may be formed as a dam structure defining each emission area EA and/or sub-emission area SEA, to which the light-emitting elements LD are to be supplied in a process of supplying the light-emitting elements LD to each pixel PXL. For example, each emission area EA and/or sub-emission area SEA may be partitioned by the bank BNK, thereby supplying a desired type and/or amount of light-emitting element ink to the emission area EA and/or the sub-emission area SEA.

Further, the bank BNK may include at least one light blocking and/or reflective material to prevent light leakage between adjacent emission areas EA and/or between adjacent sub-emission areas SEA. For example, the bank BNK may include at least one black matrix material (for example, at least one light blocking material currently known) selected from various types of black matrix materials, and/or a color filter material of a specific color. As an example, the bank BNK may be formed in a black opaque pattern capable of blocking transmission of light. In an embodiment, a reflective film may be formed on a surface (for example, a sidewall) of the bank BNK so as to increase the luminous efficiency of each pixel PXL.

In an embodiment, in addition to first openings OPNb1 exposing the first and second sub-emission areas SEA1 and SEA2 of each pixel PXL, the bank BNK may further include an opening exposing a portion of the non-emission area NEA. For example, the bank BNK may further include a second opening OPNb2 corresponding to an upper area and/or a lower area of each pixel area PXA.

Further, as illustrated in FIG. 5, the bank BNK may also be disposed in the non-emission area NEA between the first sub-emission area SEA1 and the second sub-emission area SEA2 of each pixel PXL and may further include a third opening OPNb3 partially exposing an area between the first sub-emission area SEA1 and the second sub-emission area SEA2 of each pixel PXL.

As described above, when the bank BNK is also disposed in the non-emission area NEA between the first sub-emission area SEA1 and the second sub-emission area SEA2 of each pixel PXL, a match rate between each emission area EA and a supply area of the light-emitting elements LD may be increased, thereby improving material efficiency. For example, in an operation of supplying the light-emitting elements LD to each pixel PXL through an inkjet method or the like, it is possible to prevent the light-emitting elements LD from being supplied to unnecessary areas (for example, the non-emission area NEA between the first sub-emission area SEA1 and the second sub-emission area SEA2), and it is possible to efficiently supply the light-emitting elements LD to each sub-emission area SEA. Accordingly, it is possible to prevent the light-emitting elements LD from being wasted unnecessarily and to reduce manufacturing costs of the display device.

In an embodiment, at least some of the pixel electrodes ELT may be disconnected in areas in which the second and third openings OPNb2 and OPNb3 of the bank BNK are formed. For example, in order to align the light-emitting elements LD in each sub-emission area SEA, in the entire display area DA, the pixel electrodes ELT may be divided into a plurality of groups, and the pixel electrodes ELT of each group may be formed as integral alignment lines to apply an alignment signal (e.g., a set or predetermined alignment signal). After the alignment of the light-emitting elements LD is completed, at least one alignment line is disconnected between the pixels PXL, thereby isolating each pixel PXL in a form capable of being separately driven. Further, at least some of the pixel electrodes ELT constituting the alignment lines may be disconnected and separated between the first sub-emission area SEA1 and the second sub-emission area SEA2 of each pixel PXL (for example, the areas in which the second and third openings OPNb2 and OPNb3 of the bank BNK are formed), thereby separating the pixel electrodes ELT into the pixel electrodes ELT of each series terminal.

When the light-emitting elements LD disposed in the first and second sub-emission areas SEA1 and SEA2 of each pixel PXL are to be connected in series and/or parallel, the contact electrodes CNE may be formed to connect the pixel electrodes ELT (e.g., set or predetermined pixel electrodes ELT) formed in each of the sub-emission areas SEA1 and SEA2. Accordingly, the light-emitting elements LD of each pixel PXL may be connected in series, parallel, and/or in series/parallel in a desired shape.

Accordingly, the non-emission area NEA for separating the alignment lines into the plurality of pixel electrodes ELT after alignment of the light-emitting elements LD and/or for connecting the pixel electrodes ELT through at least one contact electrode CNE may be disposed between the first sub-emission area SEA1 and the second sub-emission area SEA2. A distance (for example, a distance in the second direction DR2) between the alignment lines receiving different alignment signals in an operation of aligning the light-emitting elements LD may be formed to be relatively wide in the non-emission area NEA, thereby preventing the light-emitting elements LD from being disposed and/or aligned in the non-emission area NEA.

The shape and/or arrangement structure of the bank (BNK) may be variously changed according to embodiments. For example, as illustrated FIG. 6, in each pixel PXL, the bank BNK may include the first opening OPNb1 surrounding the entirety of an area including the first and second sub-emission areas SEA1 and SEA2 and the non-emission area NEA between the first sub-emission area SEA1 and the second sub-emission area SEA2.

The color filters CF and the light blocking pattern LBP including openings corresponding to the color filters CF are disposed on the pixels PXL. For example, the light blocking pattern LBP may be disposed on the pixels PXL to cover peripheral areas of the first and second sub-emission areas SEA including the non-emission area NEA between the first sub-emission area SEA1 and the second sub-emission area SEA2 of each subpixel PXL.

The light blocking pattern LBP may include the plurality of openings separately opened on the first sub-emission area SEA1 and the second sub-emission area SEA2. For example, the light blocking pattern LBP may be a black matrix pattern that includes separate openings corresponding to the sub-emission areas SEA and is disposed to cover the non-emission area NEA.

The color filters CF having a color (e.g., a set or predetermined color) corresponding to a color of light to be emitted from the pixel PXL may be disposed on the first and second sub-emission areas SEA of each pixel PXL. In an embodiment, separate color filter patterns having a color (e.g., a set or predetermined color) may be disposed on the first sub-emission area SEA1 and the second sub-emission areas SEA2 corresponding to the openings of the light blocking pattern LBP. For example, a plurality of color filter patterns separated from each other with the light blocking pattern LBP interposed therebetween may be disposed on the first and second sub-emission areas SEA of each pixel PXL.

The additional configurations related to the color filter CF and/or the light blocking pattern LBP will be described later with reference to FIGS. 10-16B.

Figure 7:
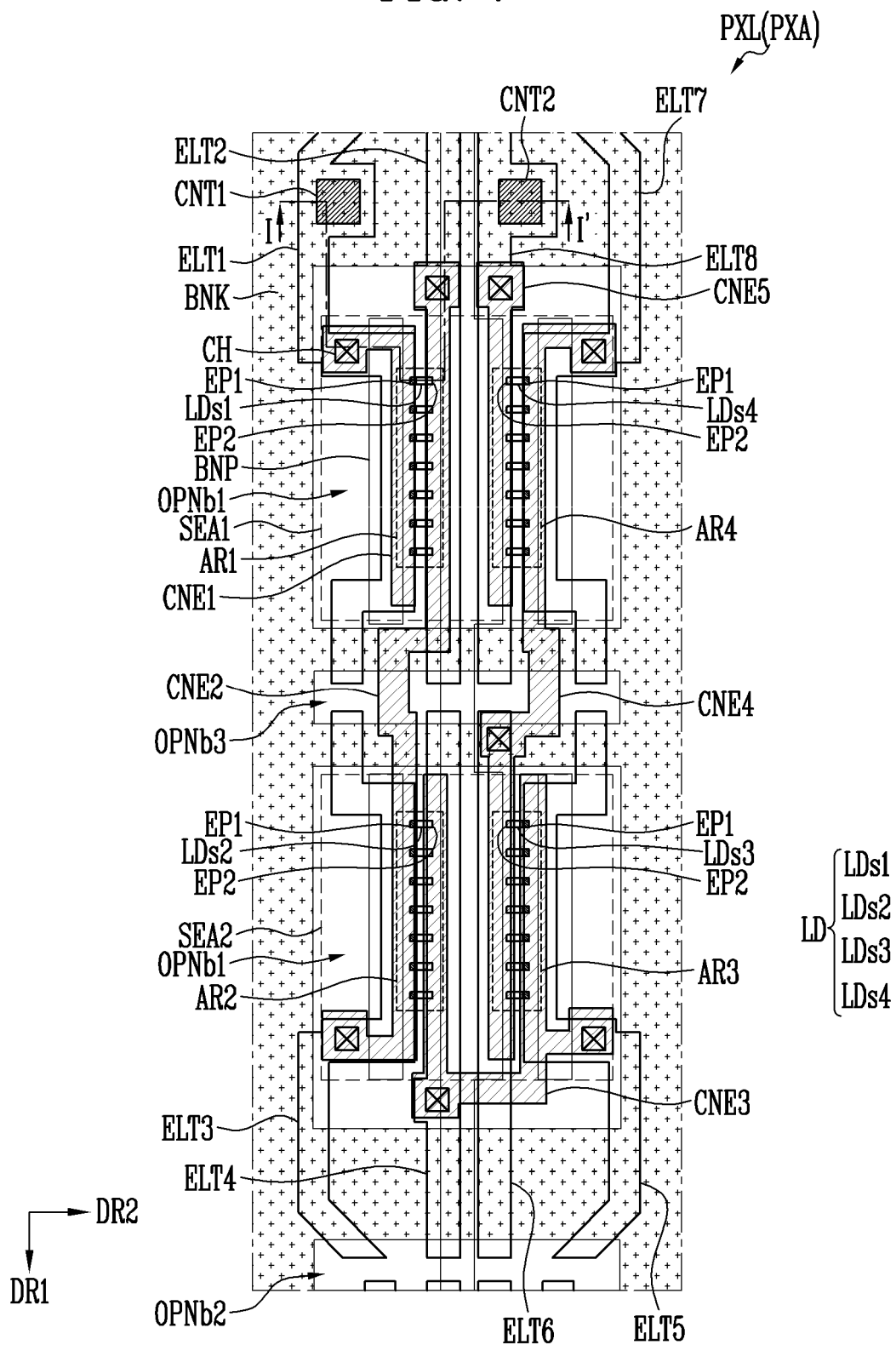
FIG. 7 is a plan view illustrating a pixel according to an embodiment of the present disclosure.

FIG. 7 is a plan view illustrating a pixel PXL according to an embodiment of the present disclosure. As an example, FIG. 7 illustrates a display layer on which light-emitting elements LD of a pixel PXL are disposed. According to some embodiments, the pixel PXL illustrated in FIG. 7 may be any one of the first, second, and third pixels PXL1, PXL2, and PXL3 illustrated in FIG. 5, and the first, second, and the third pixels PXL1, PXL2, and PXL3 may have substantially the same or similar structure. Further, FIG. 7 illustrates the embodiment in which each pixel PXL includes light-emitting elements LD disposed at four series stages as illustrated in FIGS. 4-6. However, the number of the series stages disposed in an emission area EA and/or each sub-emission area SEA of each pixel PXL may be variously changed according to embodiments.

Figure 8:
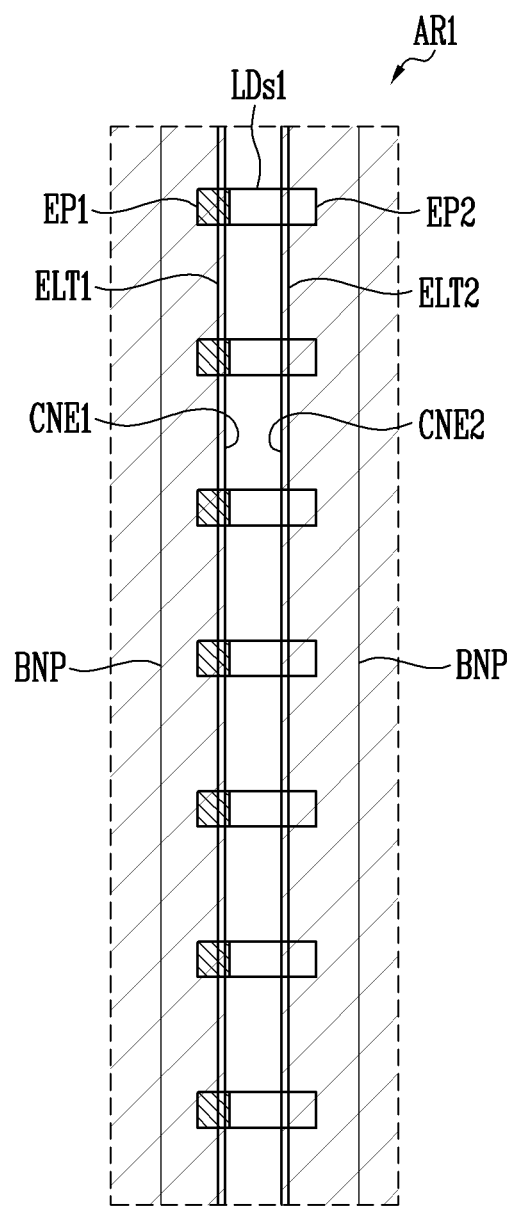
FIG. 8 is an enlarged view of area AR1 of FIG. 7.

FIG. 8 is an enlarged view of area AR1 of FIG. 7. Area AR1 may be an area in which light-emitting elements LDs1 of a first series stage are disposed and may have substantially the same or similar structure as areas AR2, AR3, and AR4 in which light-emitting elements LDs2, LDs3, and LDs4 of second, third, and fourth series stages are respectively disposed. However, the numbers of the light-emitting elements LD disposed at the series stages may be the same or different.

Referring to FIGS. 3-8, the pixel PXL may include a first electrode ELT1, a second electrode ELT2, and one or more light-emitting elements LDs1 connected between the first electrode ELT1 and the second electrode ELT2 disposed in the first sub-emission area SEA1, and a third electrode ELT3, a fourth electrode ELT4, and one or more light-emitting elements LDs2 connected between the third electrode ELT3 and the fourth electrode ELT4 disposed in the second sub-emission area SEA2. As an example, the first pixel PXL1 may include a plurality of first light-emitting elements LD1 of which one or more first light-emitting elements LD1 are disposed in each of first and second sub-emission areas SEA1[1] and SEA2[1]. Similarly, the second pixel PXL2 may include a plurality of second light-emitting elements LD2 of which one or more second light-emitting elements LD2 are disposed in each of first and second sub-emission areas SEA1[2] and SEA2[2], and the third pixel PXL3 may include a plurality of third light-emitting elements LD3 of which one or more third light-emitting elements LD3 are disposed in each of first and second sub-emission areas SEA1[3] and SEA2[3].

The pixel PXL may further include a fifth electrode ELT5, a sixth electrode ELT6, and one or more light-emitting elements LDs3 connected between the fifth electrode ELT5 and the sixth electrode ELT6 disposed in the second sub-emission area SEA2 (or first-sub emission area SEA1), and/or a seventh electrode ELT7, an eighth electrode ELT8, and one or more light-emitting elements LDs4 connected between the seventh electrode ELT7 and the eighth electrode ELT8 disposed in the first sub-emission area SEA1 (or second sub-emission area SEA2).

In each sub-emission area SEA, the first to eighth electrodes ELT1 to ELT8 may each be disposed to extend in a first direction DR1 and to be spaced from each other in a second direction DR2, but the present disclosure is not limited thereto. Further, in each pixel area PXA, the first to eighth electrodes ELT1 to ELT8 may have a uniform width or a non-uniform width and may or may not include a bent portion. That is, the shape and/or the mutual arrangement structure of each of the first to eighth electrodes ELT1 to ELT8 may be variously changed according to embodiments.

The first to eighth electrodes ELT1 to ELT8 may constitute pixel electrodes ELT of each pixel PXL. Some of the first to eighth electrodes ELT1 to ELT8 may be first formed as one alignment line and then may be disconnected and separated into the pixel electrodes ELT between adjacent pixels PXL and/or between the sub-emission areas SEA of each pixel PXL.

One pair of pixel electrodes ELT constituting each series stage may be disposed closer to each other in areas in which the light-emitting elements LD are arranged (or are to be arranged), for example, area, AR1, area AR2, area AR3, and area AR4 and may be disposed to be spaced from each other by a relatively long distance in the remaining areas. Accordingly, the light-emitting elements LD can be arranged in a desired area.

One of the pixel electrodes ELT, for example, the first electrode ELT1, may be connected to a pixel circuit PXC and/or a first power line PL1 through a first contact portion CNT1. Another one of the pixel electrodes ELT, for example, the eighth electrode ELT8, may be connected to a second power line PL2 through a second contact portion CNT2.

In an embodiment, a bank pattern BNP may be disposed under an area of each of the first to eighth electrodes ELT1 to ELT8. In this case, one area of each of the first to eighth electrodes ELT1 to ELT8 may protrude upward due to the bank pattern BNP so that a reflective partition wall may be formed around the light-emitting elements LD. Accordingly, the luminous efficiency of the pixel PXL can be improved. Each bank pattern BNP may be formed to overlap one pixel electrode ELT or may be formed to overlap the plurality of pixel electrodes ELT.

According to some embodiments, the first to eighth electrodes ELT1 to ELT8 may be in direct contact with and connected to the light-emitting elements LD of each series stage or may be connected to the light-emitting elements LD through separate contact electrodes CNE or the like. For example, the first to eighth electrodes ELT1 to ELT8 may be connected to first or second end portions EP1 and EP2 of the adjacent light-emitting elements LD through the contact electrodes CNE.

Further, any one electrode (for example, one of the first, second, seventh, and eighth electrodes ELT1, ELT2, ELT7, and ELT8) disposed in the first sub-emission area SEA1 may be connected to any one electrode (for example, one of the third to sixth electrodes ELT3 to ELT6) disposed in the second sub-emission area SEA2 through at least one contact electrode CNE. To this end, each pixel PXL may include at least one contact electrode CNE for connecting electrodes (e.g., set or predetermined electrodes) positioned in the first and second sub-emission areas SEA1 and SEA2. As an example, the pixel PXL may further include first to fifth contact electrodes CNE1 to CNE5.

The first contact electrode CNE1 may be disposed on the light-emitting elements LDs1 (e.g., the first end portions EP1) of the first series stage and the first electrode ELT1 to connect the first end portions EP1 of the light-emitting elements LDs1 of the first series stage to the first electrode ELT1.

The second contact electrode CNE2 may be disposed on the light-emitting elements LDs1 (e.g., the second end portions EP2) of the first series stage and the second electrode ELT2 to connect the second end portions EP2 of the light-emitting elements LDs1 of the first series stage to the second electrode ELT2. Further, the second contact electrode CNE2 may be disposed on the light-emitting elements LDs2 (e.g., the first end portions EP1) of the second series stage and the third electrode ELT3 to connect the first end portions EP1 of the light-emitting elements LDs2 of the second series stage to the third electrode ELT3. To this end, the second contact electrode CNE2 may extend from the first sub-emission area SEA1 to the second sub-emission area SEA2 through a non-emission area NEA between the first sub-emission area SEA1 and the second sub-emission area SEA2. However, in another embodiment, the second contact electrode CNE2 may be provided as a plurality of separate electrodes disposed in the sub-emission areas SEA, and the separate electrodes may be connected to each other through a bridge pattern or the like.

The third contact electrode CNE3 may be disposed on the light-emitting elements LDs2 (e.g., the second end portions EP2) of the second series stage and the fourth electrode ELT4 to connect the second end portions EP2 of the light-emitting elements LDs2 of the second series stage to the fourth electrode ELT4. Further, the third contact electrode CNE3 may be disposed on the light-emitting elements LDs3

(e.g., the first end portions EP1) of the third series stage and the fifth electrode ELT5 to connect the first end portions EP1 of the light-emitting elements LDs3 of the third series stage to the fifth electrode ELT5. To this end, the third contact electrode CNE3 may extend from area AR2 area to area AR3. However, in another embodiment, the third contact electrode CNE3 may be provided as a plurality of separate electrodes disposed in area AR2 and area AR3, and the separate electrodes may be connected to each other through a bridge pattern or the like.

The fourth contact electrode CNE4 may be disposed on the light-emitting elements LDs3 (e.g., the second end portions EP2) of the third series stage and the sixth electrode ELT6 to connect the second end portions EP2 of the light-emitting elements LDs3 of the third series stage to the sixth electrode ELT6. Further, the fourth contact electrode CNE4 may be disposed on the light-emitting elements LDs4 (e.g., the first end portions EP1) of the fourth series stage and the seventh electrode ELT7 to connect the first end portions EP1 of the light-emitting elements LDs4 of the fourth series stage to the seventh electrode ELT7. To this end, the fourth contact electrode CNE4 may extend from the second sub-emission area SEA2 to the first sub-emission area SEA1 through the non-emission area NEA between the first sub-emission area SEA1 and the second sub-emission area SEA2. However, in another embodiment, the fourth contact electrode CNE4 may be provided as a plurality of separate electrodes disposed in the sub-emission areas SEA, and the separate electrodes may be connected to each other through a bridge pattern or the like.

The fifth contact electrode CNE5 may be disposed on the fourth light-emitting elements LDs4 (e.g., the second end portions EP2) of the fourth series stage and the eighth electrode ELT8 to connect the second end portions EP2 of the light-emitting elements LDs4 of the fourth series stage to the eighth electrode ELT8.

In an embodiment, at least one layer of an insulating film may be interposed between each contact electrode CNE and the pixel electrode ELT, and each contact electrode CNE and the pixel electrode ELT corresponding thereto may be connected to each other through a contact hole CH formed in the insulating film. However, the connection structure between the contact electrode CNE and the pixel electrode ELT may be variously changed according to some embodiments.

According to the above-described embodiment, the pixel electrodes ELT can be connected in a desired shape using the contact electrodes CNE. As an example, the light-emitting elements LDs1 disposed in areas AR1 of the first sub-emission area SEA1, the light-emitting elements LDs2 disposed in area AR2 of the second sub-emission area SEA2, the light-emitting elements LDs3 disposed in area AR3 of the second sub-emission area SEA2, and the light-emitting elements LDs4 disposed in area AR4 of the first sub-emission area SEA1 may be sequentially connected in series.

Further, in order to increase the utilization rate of the light-emitting elements LD supplied to each emission area EMA, when an alignment signal for aligning the light-emitting elements LD is controlled or a magnetic field is formed to deflect and align the light-emitting elements LD such that a more number (or ratio) of the light-emitting elements LD are aligned in a specific direction, the pixel electrodes ELT may be connected according to the arrangement direction of the plurality of light-emitting elements LD using the contact electrodes CNE. Accordingly, it is possible to improve the utilization rate of the light-emitting elements LD and improve the luminous efficiency of the pixel PXL.

When each alignment line is separated into the plurality of pixel electrodes ELT between the first sub-emission area SEA1 and the second sub-emission area SEA2, and the pixel electrodes ELT are connected in a desired shape using the contact electrodes CNE, an area for separating the alignment lines and connecting the separated pixel electrodes ELT may be required. The area may be the non-emission area NEA in which the light-emitting elements LD are not aligned and may be positioned between the first sub-emission area SEA1 and the second sub-emission area SEA2. Accordingly, in each pixel area PXA, as a ratio (or area) of the emission area EA is decreased, a ratio (or area) of the non-emission area NEA may be increased accordingly. For example, when the number of the series stages and/or the number of the sub-emission areas SEA corresponding thereto are increased, the ratio (or area) of the non-emission areas NEA may be further increased.

As described above, when each pixel PXL includes the plurality of sub-emission areas SEA spaced from each other with the non-emission area NEA interposed therebetween, if the light blocking pattern LBP were opened corresponding to one area capable of including the sub-emission areas SEA of each pixel PXL, because an opening area of the light blocking pattern LBP may be unnecessarily increased, an increase in reflectance of external light may occur. Further, if the opening area of the light blocking patter LBP were reduced to prevent this, there would be a limit to opening the light blocking pattern LBP by a sufficient area on each sub-emission area SEA, and may result in a decrease in luminous efficiency of the pixels PXL.

Accordingly, in the present disclosure, as in the embodiments of FIGS. 5 and 6, the light blocking pattern LBP is efficiently opened in accordance with each sub-emission area SEA. Accordingly, reflection of external light can be reduced on the pixels PXL, and luminous efficiency of the pixels PXL can be improved. This will be described in detail below.

Figure 9A:
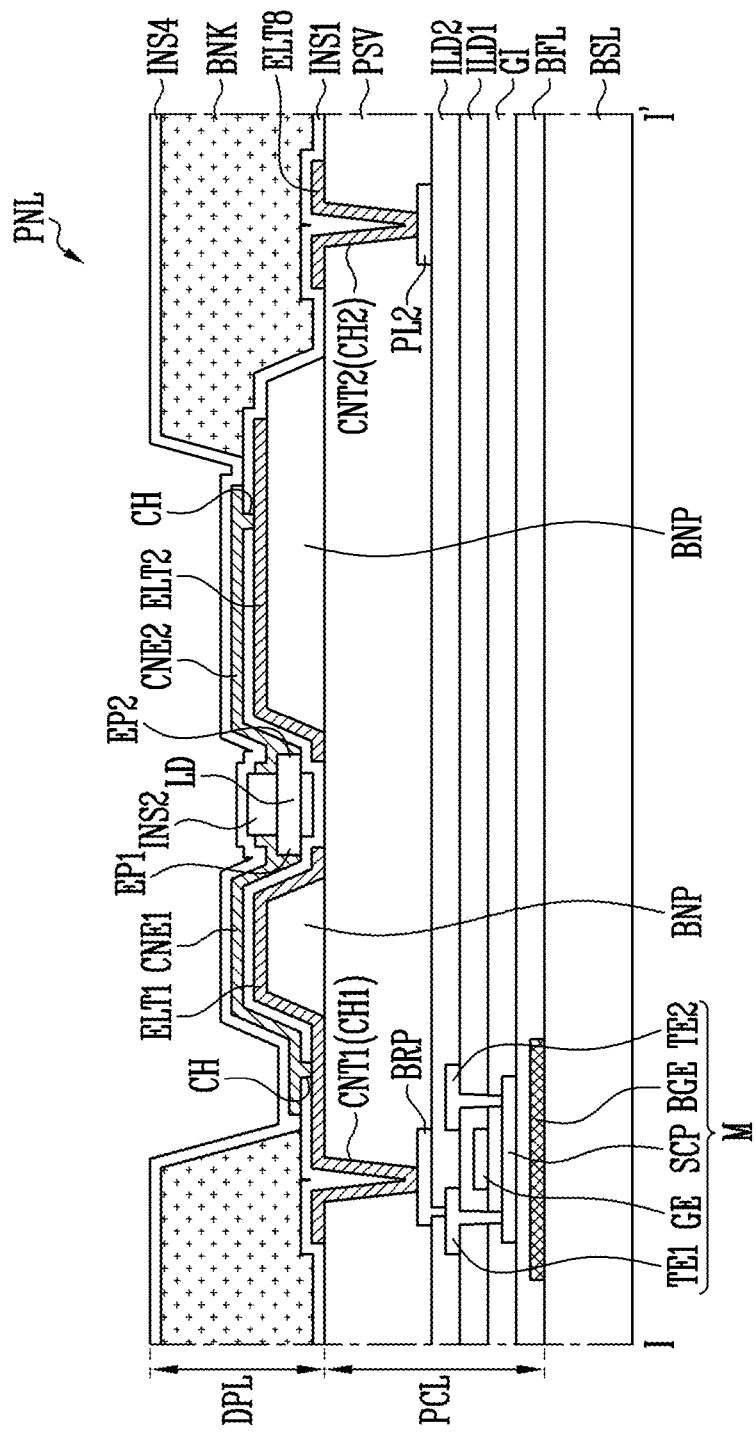
FIGS. 9A and 9B are cross-sectional views each illustrating a pixel PXL according to an embodiment of the present disclosure.
Figure 9B:
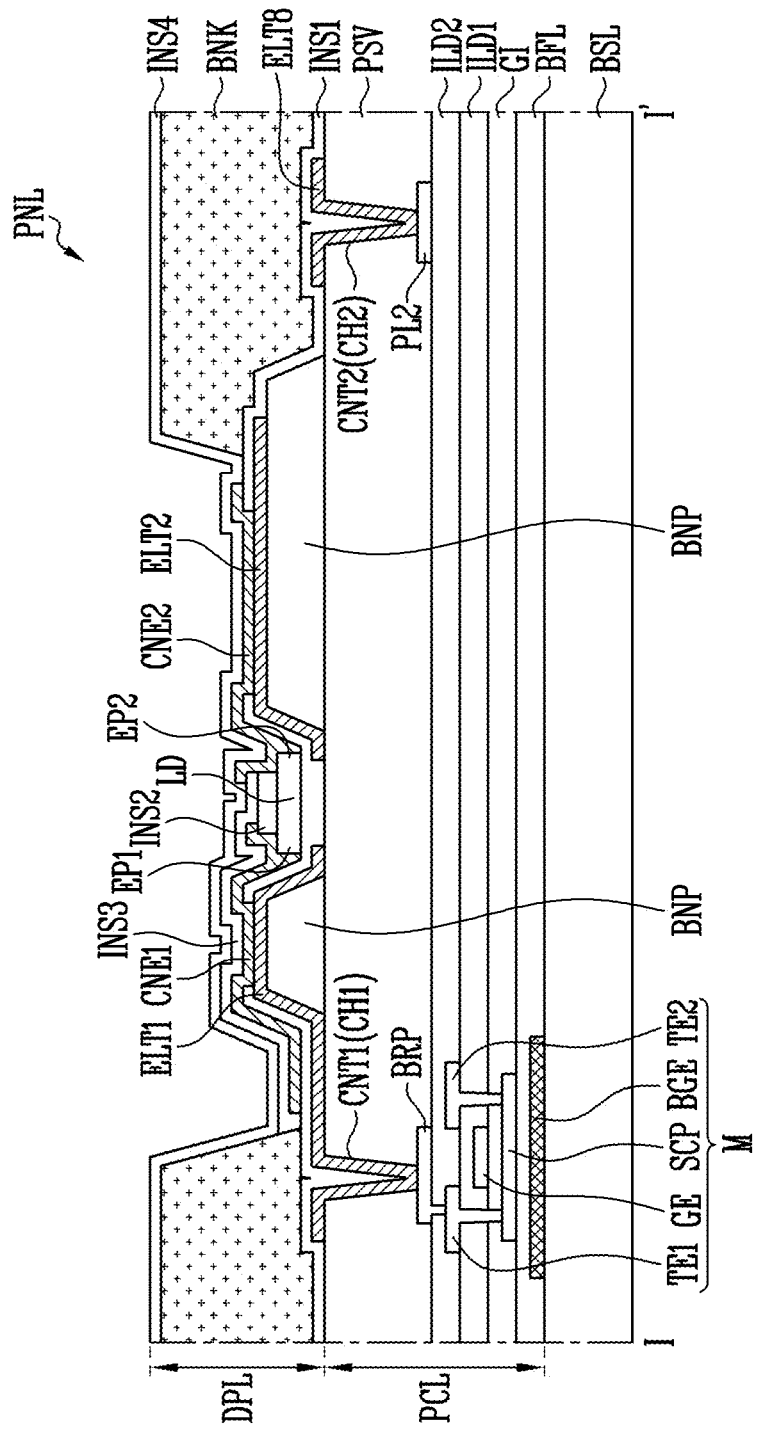

FIGS. 9A and 9B are cross-sectional views each illustrating a pixel PXL according to an embodiment of the present disclosure. As an example, FIGS. 9A and 9B illustrate different embodiments of a cross section of a pixel PXL taken along the line I-I' of FIG. 7. The embodiment of FIG. 9B further includes a third insulating layer INS3 disposed on a first contact electrode CNE1 as compared with the embodiment of FIG. 9A.

As an example of circuit elements that may be disposed on a circuit layer PCL, FIGS. 9A and 9B illustrate an arbitrary transistor M (for example, a transistor connected to a first electrode ELT1 through a first contact portion CNT1 and a bridge pattern BRP). As an example of lines that may be disposed on the circuit layer PCL, FIGS. 9A and 9B illustrate a second power line PL2 connected to an eighth electrode ELT8 through a second contact portion CNT2.

Referring to FIGS. 3-9B, the pixel PXL and a display device including the same according to an embodiment of the present disclosure may include the circuit layer PCL and a display layer DPL disposed to overlap each other on one surface of a base layer BSL. For example, a display area DA may include the circuit layer PCL disposed on one surface of the base layer BSL and the display layer DPL disposed on the circuit layer PCL. However, the mutual position of the circuit layer PCL and the display layer DPL on the base layer BSL may vary according to embodiments.

Circuit elements (for example, transistors M and a storage capacitor Cst) constituting the pixel circuit PXC of the corresponding pixel PXL and varies lines connected thereto may be disposed in each pixel area PXA of the circuit layer PCL. Pixel electrodes ELT, light-emitting elements LD, and/or contact electrodes CNE constituting a light-emitting unit EMU of the corresponding pixel PXL may be disposed in each pixel area PXA of the display layer DPL.

The circuit layer PCL may include a plurality of insulating layers in addition to the circuit elements and the lines. For example, the circuit layer PCL may include a buffer layer BFL, a gate insulating layer GI, a first interlayer insulating layer ILD1, a second interlayer insulating layer ILD2, and/or a passivation layer PSV that are sequentially stacked on one surface of the base layer BSL.

Further, the circuit layer PCL may further selectively include a first conductive layer including at least one light blocking layer or the like disposed under at least some of the transistors M (or a back gate electrode BGE of the transistor M).

The buffer layer BFL may be disposed on one surface of the base layer BSL including the first conductive layer (e.g., back gate electrode BGE of the transistor M). The buffer layer BFL may prevent impurities from diffusing into each circuit element.

A semiconductor layer may be disposed on the buffer layer BFL. The semiconductor layer may include a semiconductor pattern SCP of each transistor M. The semiconductor pattern SCP may include a channel region overlapping a gate electrode GE in a thickness direction of the base layer BSL, and first and second conductive regions (for example, source and drain regions) disposed at both sides of the channel region.

The semiconductor pattern SCP may be a semiconductor pattern made of polysilicon, amorphous silicon, an oxide semiconductor, or the like. Further, the channel region of the semiconductor pattern SCP may be a semiconductor pattern not doped with impurities and may be an intrinsic semiconductor, and the first and second conductive regions of the semiconductor pattern SCP may each be a semiconductor pattern doped with suitable impurities (e.g., set or predetermined impurities).

In an embodiment, the semiconductor patterns SCP of the transistors M constituting each pixel circuit PXC may be made of substantially the same or similar material. For example, the semiconductor patterns SCP of the transistors M may be made of the same material selected from polysilicon, amorphous silicon, and an oxide semiconductor.

In another embodiment, some of the transistors M and the remaining transistors M may include semiconductor patterns SCP made of different materials. For example, among the transistors M, the semiconductor pattern SCP of some transistors may be made of polysilicon or amorphous silicon, and the semiconductor pattern SCP of the reaming transistors M may be made of an oxide semiconductor.

The gate insulating layer GI may be disposed on the semiconductor layer. The second conductive layer may be disposed on the gate insulating layer GI.

The second conductive layer may include the gate electrode GE of each transistor M. The second conductive layer may further include one electrode of the storage capacitor Cst and/or lines (e.g., (set or predetermined lines).

The first interlayer insulating layer ILD1 may be disposed on the second conductive layer. A third conductive layer may be disposed on the first interlayer insulating layer ILD1.

The third conductive layer may include first and second transistor electrodes TE1 and TE2 of each transistor M. Here, the first and second transistor electrodes TE1 and TE2 may be source and drain electrodes SE and DE of the transistor M. The third conductive layer may further include one electrode of the storage capacitor Cst and/or lines (e.g., set or predetermined lines).

The second interlayer insulating layer ILD2 may be disposed on the third conductive layer. A fourth conductive layer may be disposed on the second interlayer insulating layer ILD2.

Each of the buffer layer BFL, the gate insulating layer GI, the first interlayer insulating layer ILD1, and the second interlayer insulating layer ILD2 may be formed as a single-layer or multi-layer and may include at least one inorganic insulating material and/or organic insulating material. For example, each of the buffer layer BFL, the gate insulating layer GI, the first interlayer insulating layer ILD1, and the second interlayer insulating layer ILD2 may include various types of organic/inorganic insulating materials such as silicon nitride ($SiN_x$), silicon oxide ($SiO_x$), and silicon oxynitride ($SiO_xN_y$).

The fourth conductive layer may include a bridge pattern BRP for connecting the circuit layer PCL and the display layer DPL and/or certain lines (for example, a first power line PL1 and/or the second power line PL2). The bridge pattern BRP may be connected to a first pixel electrode (for example, the first electrode ELT1) of each light-emitting unit EMU through a contact hole CH1 formed in the first contact portion CNT1. The second power line PL2 may be connected to a last pixel electrode (for example, the eighth electrode ELT8) of each light-emitting unit EMU through a second contact hole CH2 formed in the second contact portion CNT2.

Each of conductive patterns, electrodes, and/or lines constituting the first to fourth conductive layers may include at least one conductive material to have conductivity, and the structural material thereof is not particularly limited. As an example, each of the conductive patterns, electrodes, and/or lines constituting the first to fourth conductive layers may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), but the present disclosure is not limited thereto.

The passivation layer PSV may be disposed on the fourth conductive layer. According to some embodiments, the passivation layer PSV may include an organic insulating layer at least and may substantially planarize a surface of the circuit layer PCL.

The passivation layer PSV may be provided as a single-layer or a multi-layer and may include at least one inorganic insulating material and/or organic insulating material. For example, the passivation layer PSV may include at least one organic insulating film and may substantially planarize the surface of the circuit layer PCL. In an embodiment, the organic insulating film may include at least one selected from an acrylic-based resin (polyacrylate-based resin), an epoxy-based resin, a phenolic resin, a polyimide-based resin, a polyimide-based resin, an unsaturated polyester-based resin, a poly-phenylene ether-based resin, a polyphenylene sulfide-based resin, and a benzocyclobutene resin, but the present disclosure is not limited thereto.

The display layer DPL may be disposed on the passivation layer PSV.

The display layer DPL may include the light-emitting unit EMU of each pixel PXL. For example, the display layer DPL may include the plurality of pixel electrodes ELT (for example, the first to eighth electrodes ELT1 to ELT8), the plurality of light-emitting elements LD connected in series, parallel, or series-parallel between the pixel electrodes ELT, and the plurality of contact electrodes CNE connecting the pixel electrodes ELT and the light-emitting elements LD, that are disposed in sub-emission areas SEA of each pixel PXL.

While, one light-emitting element LD is illustrated in each of FIGS. 9A and 9B, as in the embodiments of FIGS. 4-8, each pixel PXL may include a plurality of light-emitting elements LD connected in a forward direction between the first pixel electrode and the last pixel electrode (for example, the first electrode ELT1 and the eighth electrode ELT8). Accordingly, in describing the embodiments of FIGS. 9A and 9B and other embodiments to be described below, each embodiment will be described below assuming that the pixel PXL includes a plurality of light-emitting elements LD.

Further, the display layer DPL may include a separate or integral bank pattern BNP for making one area of each of the pixel electrodes ELT protrude in an upward direction (e.g., a thickness direction of the base layer BSL), and/or a bank BNK for surrounding each of the emission areas EA (or each of the sub-emission areas SEA). Further, the display layer DPL may further include at least one conductive layer and/or at least one insulating layer.

For example, the display layer DPL may include the bank pattern BNP, the pixel electrodes ELT, a first insulating layer INS1, the light-emitting elements LD, a second insulating layer INS2, the contact electrodes CNE, and a fourth insulating layer INS4 that are sequentially disposed and/or formed on the circuit layer PCL. In an embodiment, as illustrated in FIG. 9A, two contact electrodes CNE (for example, first and second contact electrodes CNE1 and CNE2) facing (or opposite) each other with the light-emitting elements LD interposed therebetween may be disposed coplanar with each other. In another embodiment, as illustrated in FIG. 9B, two contact electrodes CNE (for example, the first and second contact electrodes CNE1 and CNE2) facing (or opposite) each other with the light-emitting elements LD interposed therebetween may be separated and disposed on different layers. In this case, the display layer DPL may further include the third insulating layer INS3 interposed between the contact electrodes CNE. As an example, the third insulating layer INS3 may cover the first contact electrode CNE1, and one end portion of the third insulating layer INS3 may be interposed between the first contact electrode CNE1 and the second contact electrode CNE2.

The position of the bank BNK in a cross section may be variously changed according to embodiments. In an embodiment, the bank BNK may be formed on the first insulating layer INS1, but the present disclosure is not limited thereto. For example, in another embodiment, the bank BNK may be disposed coplanar with the bank pattern BNP. Further, the bank BNK may or may not overlap the bank pattern BNP.

The bank pattern BNP may be disposed on one surface of the base layer BSL on which the circuit layer PCL is selectively formed. The bank pattern BNP may be for forming a wall structure around the light-emitting elements LD and may be formed as a separate or integral pattern. The bank pattern BNP may protrude from one surface of the base layer BSL in a height direction thereof (e.g., a thickness direction of the base layer BSL). Accordingly, one area of the pixel electrode ELT disposed on each bank pattern BNP may protrude upward.

The bank pattern BNP may include an insulating material including at least one inorganic material and/or organic material. As an example, the bank pattern BNP may include at least one layer of an inorganic film including various inorganic insulating materials such as silicon nitride ($SiN_x$), silicon oxide (SiOx), and silicon oxynitride ($SiO_xN_y$). Alternatively, the bank pattern BNP may include at least one layer of an organic film including various types of organic insulating materials or may be provided as an insulator formed as a single-layer or multi-layer including organic/inorganic materials in combination.

A reflective partition wall may be formed around the light-emitting elements LD due to the bank pattern BNP and the pixel electrodes ELT disposed thereon. As an example, when the pixel electrodes ELT includes a reflective electrode layer at least, light emitted from both end portions of the light-emitting elements LD may be reflected from the reflective electrode layer to be emitted in an upward direction of the each pixel PXL.

The bank pattern BNP may have various shapes. In an embodiment, as illustrated in FIGS. 9A and 9B, the bank pattern BNP may be formed to have an inclined surface inclined at an angle in a suitable range (e.g., a set or predetermined range) with respect to the base layer BSL. In another embodiment, the bank pattern BNP may have a curved surface or sidewalls having a step shape. As an example, the bank pattern BNP may have a cross section having a semicircular or semi-ellipse shape.

Electrodes and/or insulating layers disposed on the bank pattern BNP may have a shape corresponding to the bank pattern BNP. As an example, each pixel electrode ELT may include an inclined surface or a curved surface having a shape corresponding to the shape of the bank pattern BNP around the light-emitting elements LD. However, the pixel PXL may not include the bank pattern BNP according to some embodiments.

The pixel electrodes ELT of each pixel PXL may be disposed on the bank pattern BNP. For example, the pixel electrodes ELT may be disposed so as to be spaced from each other in each sub-emission area SEA.

According to some embodiments, each pixel electrode ELT may have a pattern separated for each pixel PXL or a pattern connected in common to the plurality of pixels PXL. For example, each of the first to eighth electrodes ELT1 to ELT8 may have an independent pattern in which both ends thereof are disconnected in a peripheral area of the corresponding pixel area PXA and/or between adjacent pixel areas PXA. In another embodiment, at least one pixel electrode (for example, the first electrode ELT1) may have an independent pattern disconnected in the peripheral area of the corresponding pixel area PXA and/or between adjacent pixel areas PXA. At least another pixel electrode (for example, the eighth electrode ELT8) may have one end that extends in a first direction DR1 or a second direction DR2 and is integrally connected to a pixel electrode (e.g., a set or predetermined pixel electrode) of another adjacent pixel PXL (for example, the eighth electrode ELT8 of the adjacent pixel PXL) in the first direction DR1 or the second direction DR2.

Each pixel electrode ELT may include at least one conductive material to have conductivity. As an example, the pixel electrodes ELT may include at least one metal selected from various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an ally including the at least one metal, or may include at least one conductive material selected from a conductive oxide such as indium tin oxide (ITO), indium zinc oxide (IZO), indium tin zinc oxide (ITZO), zinc oxide (ZnO), aluminum-doped zinc oxide (AZO), gallium-doped zinc oxide (GZO), zinc tin oxide (ZTO), gallium tin oxide (ZTO), or fluorine-doped tin oxide (FTO), and a conductive polymer such as poly(3,4-ethylenedioxythiophene) (PEDOT), but the present disclosure is not limited thereto. For example, the pixel electrodes ELT may include other conductive materials such as carbon nanotubes or graphene. That is, the pixel electrodes ELT may include at least one selected from various conductive materials to have conductivity, and a material constituting the pixel electrodes ELT is not particularly limited. Further, the pixel electrodes ELT may include the same conductive material or different conductive materials.

Each pixel electrode ELT may be formed as a single-layer or multi-layer. As an example, the pixel electrodes ELT may include a reflective electrode layer including a reflective conductive material (for example, a metal). In addition, the pixel electrodes ELT may selectively further include at least one of at least one transparent electrode layer disposed on and/or under the reflective electrode layer and at least one conductive capping layer covering upper portions of the reflective electrode layer and/or the transparent electrode layer.

The first insulating layer INS1 is disposed on one surface of the base layer BSL including the pixel electrodes ELT. In an embodiment, as illustrated in FIG. 9A, the first insulating layer INS1 may have contact holes CH for connecting the pixel electrodes ELT to the contact electrodes CNE. In another embodiment, as illustrated in FIG. 9B, the first insulating layer INS1 may be opened more widely on the bank pattern BNP or the like, and in opened areas of the first insulating layer INS1, the pixel electrodes ELT may be connected to the contact electrodes CNE. In still another embodiment, the first insulating layer INS1 may be disposed locally only in areas between the pixel electrodes ELT and the light-emitting elements LD.

The first insulating layer INS1 may be formed as a single-layer or a multi-layer and may include at least one inorganic insulating material and/or organic insulating material. In an embodiment, the first insulating layer INS1 may include at least one layer of an inorganic insulating film including at least one inorganic insulating material selected from silicon nitride ($SiN_x$), silicon oxide ($SiO_x$), and silicon oxynitride ($SiO_xN_y$).

In an embodiment, the first insulating layer INS1 may be formed to primarily and entirely cover the first and second electrodes ELT1 and ELT2. After the light-emitting elements LD are supplied and aligned on the first insulating layer INS1, the first insulating layer INS1 may be partially opened to expose one areas of the pixel electrodes ELT. Because the pixel electrodes ELT are formed and then covered by the first insulating layer INS1 or the like, it is possible to prevent damage to the pixel electrodes ELT in a subsequent process.

The light-emitting elements LD may be supplied and aligned in each emission area EA (or each sub-emission area SEA) in which the first insulating layer INS1 and the like are formed. In an embodiment, before the light-emitting elements LD are supplied, the bank BNK may be formed in the display area DA to surround each emission area EA (or each sub-emission area SEA). Thereafter, the plurality of light-emitting elements LD may be supplied to the emission area EA of each pixel PXL through an inkjet method, a slit coating method, or other various methods, and an alignment signal (e.g., a set or predetermined alignment signal) (or alignment voltage) may be applied to each of the pixel electrodes ELT (alignment lines before being divided into the pixel electrodes ELT), thereby aligning the light-emitting elements LD between the pixel electrodes ELT.

In an embodiment, at least some of the light-emitting elements LD may be disposed in a lateral direction, diagonal direction, or the like between one pair of pixel electrodes ELT such that both end portions (that is, first and second end portions EP1 and EP2) in a length direction thereof overlap or do not overlap the one pair of pixel electrodes ELT adjacent thereto. Furthermore, both end portions of the light-emitting elements LD may be in direct contact with each pixel electrode ELT or may be connected to each pixel electrode ELT through each contact electrode CNE.

The second insulating layer INS2 may be disposed on one areas of the light-emitting elements LD. The second insulating layer INS2 may be disposed on one area of each of the light-emitting elements LD so as to expose the first and second end portions EP1 and EP2 of each of the light-emitting elements LD.

The second insulating layer INS2 may be formed as a single-layer or a multi-layer and may include at least one inorganic insulating material and/or organic insulating material. For example, the second insulating layer INS2 may include various types of organic/inorganic insulating materials such as silicon nitride ($SiN_x$), silicon oxide ($SiO_x$), silicon oxynitride ($SiO_xN_y$), aluminum oxide ($Al_2O_3$), and a photoresist (PR) material.

The second insulating layer INS2 may be omitted according to embodiments. In this case, one end of each of the contact electrodes CNE may be positioned directly on the upper surfaces of the adjacent light-emitting elements LD.

When the second insulating layer INS2 is formed on the light-emitting elements LD after the alignment of the light-emitting elements LD is completed, it is possible to prevent the light-emitting elements LD from being separated from the aligned position thereof.

Both end portions of the light-emitting elements LD not covered by the second insulating layer INS2, that is, the first and second end portions EP1 and EP2 may be covered by the contact electrodes CNE and may be connected to the pixel electrodes ELT through the contact electrodes CNE.

When the contact electrodes CNE are formed coplanar with each other as in the embodiment of FIG. 9A, the contact electrodes CNE may be formed concurrently (e.g., formed simultaneously) in the same process or may be sequentially formed, and the third insulating layer INS3 may be omitted. In this case, it is possible to simplify a manufacturing process of the pixel PXL and a display device including the same.

On the other hand, when the contact electrodes CNE are formed coplanar on different layer on one surface of the base layer BSL as in the embodiment of FIG. 9B, the third insulating layer INS3 may be formed between the contact electrodes CNE.

The third insulating layer INS3 may be disposed to cover one of one pair of contact electrodes CNE (for example, the first contact electrode CNE1). When the second and/or third insulating layers INS2 and INS3 are formed on the light-emitting elements LD, it is possible to secure electrical stability between the first end portions EP1 and the second end portions EP2 of the light-emitting elements LD. For example, one pair of adjacent contact electrodes CNE may be stably separated by the second and/or third insulating layers INS2 and INS3. Accordingly, it is possible to prevent the occurrence of short circuit defects between the first end portions EP1 and the second end portions EP2 of the light-emitting elements LD.

The third insulating layer INS3 may be formed as a single-layer or a multi-layer and may include at least one inorganic insulating material and/or organic insulating material. In an embodiment, the third insulating layer INS3 may include at least one layer of an inorganic insulating film including at least one inorganic insulating material selected from silicon nitride ($SiN_x$), silicon oxide ($SiO_x$), and silicon oxynitride ($SiO_xN_y$).

The contact electrodes CNE may be made of various transparent conductive materials. As an example, the contact electrodes CNE may include at least one selected from various transparent conductive materials such as ITO, IZO, ITZO, ZnO, AZO, GZO, ZTO, GTO, and FTO and may be implemented to be substantially transparent or semi-transparent so as to satisfy a suitable transmittance (e.g., a set or predetermined transmittance). Accordingly, light emitted from the light-emitting elements LD through the respective first and second end portion EP1 and EP2 may pass through the contact electrodes CNE to be emitted to the outside of the pixel PXL.

The fourth insulating layer INS4 may be disposed on the contact electrodes CNE and/or the third insulating layer INS3. For example, the fourth insulating layer INS4 may be entirely formed on the display area DA to cover the bank pattern BNP, the pixel electrodes ELT, the first, second, and third insulating layers INS1, INS2, and INS3, the light-emitting elements LD, the contact electrodes CNE and/or the bank BNK.

The fourth insulating layer INS4 may include at least one layer of an inorganic film and/or organic film. For example, the fourth insulating layer INS4 may be formed as a single-layer or a multi-layer and may include at least one inorganic insulating material and/or organic insulating material. As an example, the fourth insulating layer INS4 may include various types of organic/inorganic insulating materials such as silicon nitride ($SiN_x$), silicon oxide ($SiO_x$), silicon oxynitride ($SiO_xN_y$), and aluminum oxide ($Al_2O_3$).

In an embodiment, the fourth insulating layer INS4 may include a thin film encapsulation layer having a multi-layered structure. For example, the fourth insulating layer INS4 may include a thin film encapsulation layer having a multi-layered structure, which includes at least two inorganic insulating layers and at least one organic insulating layer interposed between the at least two inorganic insulating layers. However, the structural material and/or structure of the fourth insulating layer INS4 may be variously changed. According to some embodiments, at least one overcoat layer, a filler layer, and/or an upper substrate may be further disposed on the fourth insulating layer INS4.

FIG. 10 is a plan view illustrating a light blocking pattern LBP and a color filter CF of a display device according to an embodiment of the present disclosure. As an example, FIG. 10 illustrates the embodiment in which first, second, and third color filters CF1, CF2, and CF3 disposed on the first, second, and third pixels PXL1, PXL2, and PXL3 of FIG. 5, and the light blocking pattern LBP disposed between the first color filter CF1, the second color filter CF2, and the third color filter CF3.

Referring to FIGS. 5 and 10, the light blocking pattern LBP may include a plurality of openings OPN that are separated and opened to correspond to sub-emission areas SEA. For example, the light blocking pattern LBP may include a plurality of first openings OPN1 corresponding to first and second sub-emission areas SEA1[1] and SEA2[1] of the first pixel PXL1, a plurality of second openings OPN2 corresponding to first and second sub-emission areas SEA1[2] and SEA2[2] of the second pixel PXL2, and a plurality of third openings OPN3 corresponding to first and second sub-emission areas SEA1[3] and SEA2[3] of the third pixel PXL3. Further, the light blocking pattern LBP may be disposed on the first to third pixels PXL1, PXL2, and PXL3 to overlap a non-emission area NEA between a first sub-emission areas SEA1 and a second sub-emission area SEA2 of each of the first to third pixels PXL1, PXL2, and PXL3.

The light blocking pattern LBP may include at least one black matrix material (for example, at least one light blocking material currently known) selected from various types of black matrix materials, and/or a color filter material of a specific color. For example, the light blocking pattern LBP may be formed as a black opaque pattern to block light transmission.

The first openings OPN1 may include a first-first opening OPN1-1 corresponding to the first sub-emission area SEA1[1] of the first pixel PXL1 and a first-second opening OPN1-2 corresponding to the second sub-emission area SEA2[1] of the first pixel PXL1. The first-first opening OPN1-1 and the first-second opening OPN1-2 may overlap a first-first color filter pattern CFP1-1 and a first-second color filter pattern CFP1-2, respectively.

The second openings OPN2 may include a second-first opening OPN2-1 corresponding to the first sub-emission area SEA1[2] of the second pixel PXL2 and a second-second opening OPN2-2 corresponding to the second sub-emission area SEA2[2] of the second pixel PXL2. The second-first opening OPN2-1 and the second-second opening OPN2-2 may overlap a second-first color filter pattern CFP2-1 and a second-second color filter pattern CFP2-2, respectively.

The third openings OPN3 may include a third-first opening OPN3-1 corresponding to the first sub-emission area SEA1[3] of the third pixel PXL3 and a third-second opening OPN3-2 corresponding to the second sub-emission area SEA2[3] of the third pixel PXL3. The third-first opening OPN3-1 and the third-second opening OPN3-2 may overlap a third-first color filter pattern CFP3-1 and a third-second color filter pattern CFP3-2, respectively.

In an embodiment, the openings OPN of the light blocking pattern LBP may have substantially the same or similar size (for example, area) or may have different sizes. For example, the size (or ratio) of the first to third openings OPN1, OPN2, and OPN3 may be adjusted in order to improve visibility characteristics according to the reflection of external light.

As an example, when it is assumed that the first pixel PXL1, the second pixel PXL2, and the third pixel PXL3 are respectively a blue pixel, a green pixel, and a red pixel, and blue color filter patterns, green color filter patterns, and red color filter patterns are respectively disposed in the first openings OPN1, the second openings OPN2, and the third openings OPN3, each of the openings OPN1 may be formed to have a size smaller than a size of each of the second and third openings OPN2 and OPN3 to adjust an area ratio of the first to third openings OPN1 to OPN3 (and/or the first to third color filters CF1 to CF3), thereby reducing or minimizing a decrease in visibility characteristics due to the reflection of external light.

The color filter CF having a suitable color (e.g., a set or predetermined color) corresponding to each pixel PXL may be disposed in each opening OPN of the light blocking pattern LBP. For example, the first color filter CF1 having a first color may be disposed in the first openings OPN1 on the first pixel PXL1, the second color filter CF2 having a second color may be disposed in the second openings OPN2 on the second pixel PXL2, and the third color filter CF3 having a third color may be disposed in the third openings OPN3 on the third pixel PXL3.

For example, the first color filter CF1 including a plurality of color filter patterns corresponding to the first and second sub-emission areas SEA1[1] and SEA2[1] of the first pixel PXL1 may be disposed on the first pixel PXL1. The light blocking pattern LBP may be disposed between the color filter patterns.

As an example, the first color filter CF1 may include the first-first color filter pattern CFP1-1 disposed on the first sub-emission area SEA1[1] of the first pixel PXL1 and the first-second color filter CFP1-2 disposed on the second sub-emission area SEA2[1] of the first pixel PXL1. The first-first color filter pattern CFP1-1 and the first-second color filter pattern CFP1-2 may be formed as patterns separated from each other. For example, the first-first color filter pattern CFP1-1 and the first-second color filter pattern CFP1-2 may be separated from each other with the light blocking pattern LBP interposed therebetween.

The first color filter CF1 may be a color filter that selectively transmits light having a color corresponding to the first pixel PXL1. For example, the first color filter CF1 may be a color filter having a first color (for example, a blue color filter).

The second color filter CF2 including a plurality of color filter patterns corresponding to the first and second sub-emission areas SEA1[2] and SEA2[2] of the second pixel PXL2 may be disposed on the second pixel PXL2. The light blocking pattern LBP may be disposed between the color filter patterns.

The second color filter CF2 may include the second-first color filter pattern CFP2-1 disposed on the first sub-emission area SEA1[2] of the second pixel PXL2 and the second-second color filter pattern CFP2-2 disposed on the second sub-emission area SEA2[2] of the second pixel PXL2. The second-first color filter pattern CFP2-1 and the second-second color filter pattern CFP2-2 may be formed as patterns separated from each other. For example, the second-first color filter pattern CFP2-1 and the second-second color filter pattern CFP2-2 may be separated from each other with the light blocking pattern LBP interposed therebetween.

The second color filter CF2 may be a color filter that selectively transmits light having a color corresponding to the second pixel PXL2. For example, the second color filter CF2 may be a color filter having a second color (for example, a green color filter).

The third color filter CF3 including a plurality of color filter patterns corresponding to the first and second sub-emission areas SEA1[3] and SEA2[3] of the third pixel PXL3 may be disposed on the third pixel PXL3. The light blocking pattern LBP may be disposed between the color filter patterns.

As an example, the third color filter CF3 includes the third-first color filter pattern CFP3-1 disposed on the first sub-emission area SEA1[3] of the third pixel PXL3 and the third-second color filter pattern CFP3-2 on the second sub-emission area SEA2[3] of the third pixel PXL3. The third-first color filter pattern CFP3-1 and the third-second color filter pattern CFP3-2 may be formed as patterns separated from each other. For example, the third-first color filter pattern CFP3-1 and the third-second color filter pattern CFP3-2 may be separated from each other with the light blocking pattern LBP interposed therebetween.

The third color filter CF3 may be a color filter that selectively transmits light having a color corresponding to the third pixel PXL3. For example, the third color filter CF3 may be a color filter having a third color (for example, a red color filter).

In an embodiment, the first to third color filters CF1, CF2, and CF3 may include the color filter patterns having sizes corresponding to the sizes of the first, second, and third openings OPN1, OPN2, and OPN3, respectively. For example, an area of each of the first-first color filter pattern CFP1-1 and the first-second color filter pattern CFP1-2 may be smaller than an area of each of the second-first color filter pattern CFP2-1 and the second-second color filter pattern CFP2-2, the third-first color filter pattern CFP3-1, and the third-second color filter pattern CFP3-2. However, the relative size and/or arrangement structure of the first to third color filters CF1, CF2, and CF3 may be variously changed according to some embodiments.

In the above-described embodiments of FIGS. 5-10, each pixel PXL includes the plurality of sub-emission areas SEA spaced from each other. The light blocking pattern LBP is separated and opened to cover areas between the sub-emission areas SEA on each pixel PXL. That is, the light blocking pattern LBP is effectively opened by as much as a necessary area in response to each sub-emission area SEA and is disposed to cover the non-emission area NEA between the sub-emission areas SEA. For example, in the present disclosure, the opened position and/or area of the light blocking pattern LBP may be optimized according to each sub-emission area SEA. Further, the first, second, and third color filters CF1, CF2, and CF3 may be disposed in respective openings OPN corresponding to respective sub-emission areas SEA.

Accordingly, even though an emission area EA of each pixel PXL is divided into the plurality of sub-emission areas SEA and thus the number of the non-emission area NEA is increased in the pixel area PXA, the opened area of the light blocking pattern LBP may be reduced or minimized by increasing a match rate between the openings OPN (and/or the arrangement areas of the color filters CF) and the emission areas EA. Accordingly, the reflectance of external light can be reduced in an entire display area DA including an upper portion of each pixel PXL, and the image quality of the display device can be improved.

Further, because the loss of the opened area of the light blocking pattern LBP is reduced or minimized, the light blocking pattern LBP can be sufficiently opened on each sub-emission area SEA. Accordingly, it is possible to sufficiently secure and/or improve the luminous efficiency of the pixels PXL.

While, in the embodiments of FIGS. 5-10, the embodiment has been described in which each pixel PXL includes two sub-emission areas SEA, the number of the sub-emission areas SEA may be variously changed according to embodiments. For example, in another embodiment, the emission area EA of each pixel PXL may be provided with three or more sub-emission areas SEA. Even in this case, as in the above-described embodiments, a light blocking pattern LBP may be formed to cover the non-emission area NEA between the sub-emission areas SEA and to also include separate openings OPN corresponding to the sub-emission areas SEA, and a color filter CF having a suitable color (e.g., a set or predetermined color) may be disposed in each opening OPN of the light blocking pattern LBP. Accordingly, even though the number of the sub-emission areas SEA is increased, the light blocking pattern LBP is efficiently opened in response to each sub-emission area SEA, thereby reducing the reflectance of external light and securing the luminous efficiency of the pixels PXL.

Figure 11:
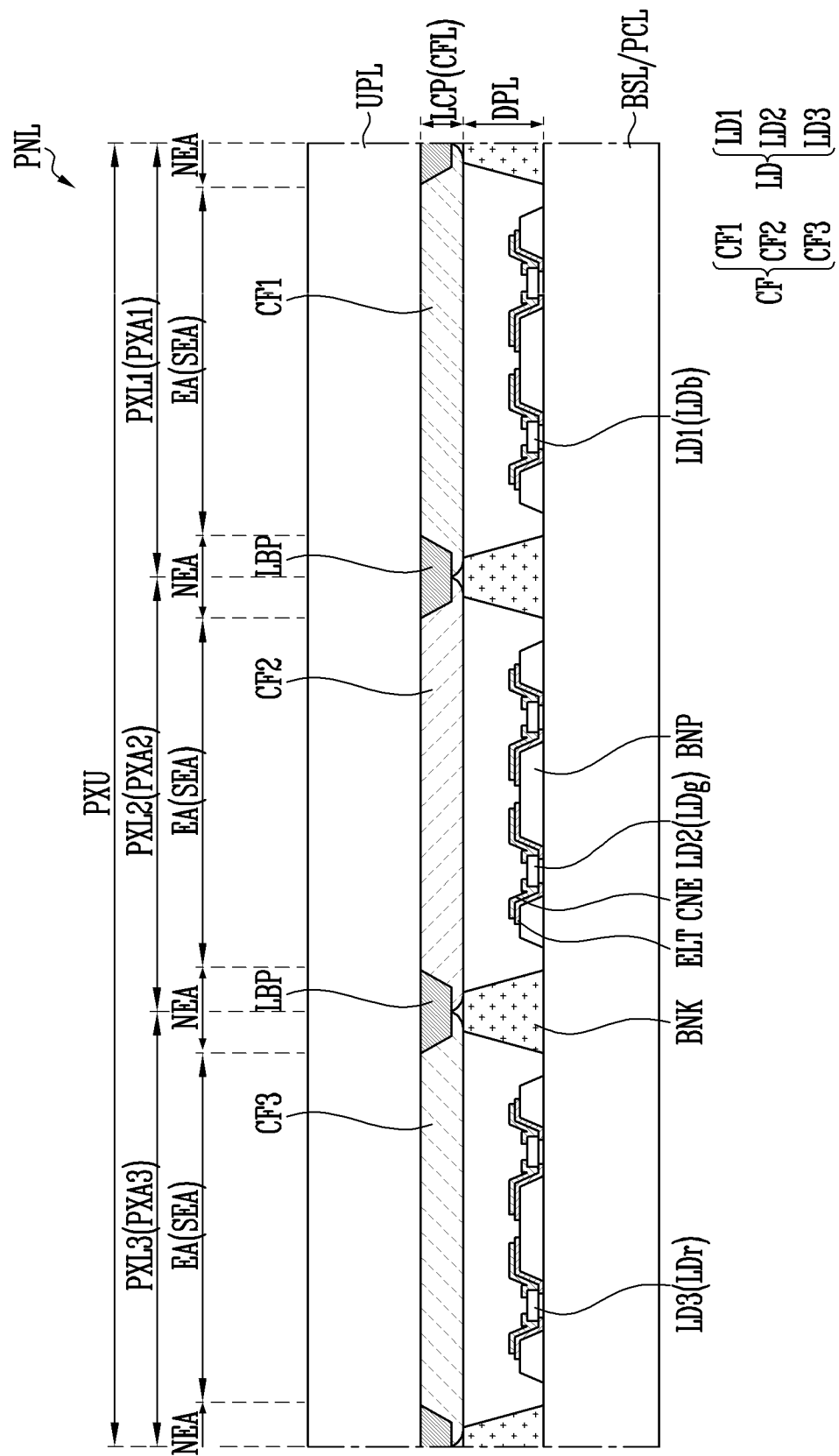
FIGS. 11-15 are cross-sectional views each illustrating a display device according to an embodiment of the present disclosure.

FIGS. 11-15 are cross-sectional views each illustrating a display device according to an embodiment of the present disclosure. For example, FIG. 11 illustrates an embodiment of a display panel PNL that does not include color conversion particles (for example, red and green quantum dots QDr and QDg), and FIGS. 12-15 illustrate different embodiments of the display panel PNL that include the color conversion particles. That is, the display device according to the present disclosure may selectively include the color conversion particles disposed on pixels PXL.

FIGS. 11-15 illustrates a cross section of a display panel PNL based on an area in which one pixel unit PXU including a first pixel PXL1, a second pixel PXL2, and a third pixel PXL3 adjacent to each other is disposed. Because the structure of each pixel PXL has been described in detail through the above-described embodiments, in FIGS. 11 and 15, the structure of each pixel PXL is schematically illustrated based on pixel electrodes ELT, light-emitting elements LD, and contact electrodes CNE, and detailed descriptions thereof will be omitted. As an example, FIGS. 11-15 schematically illustrate a cross section of the display panel PNL, in which the pixel unit PXU illustrated in FIG. 5 is disposed, in a second direction DR2. In the embodiments of FIGS. 11-15, components similar or identical to those of the above-described embodiments are denoted by the same reference numerals, and detailed descriptions thereof will be omitted.

Figure 15:
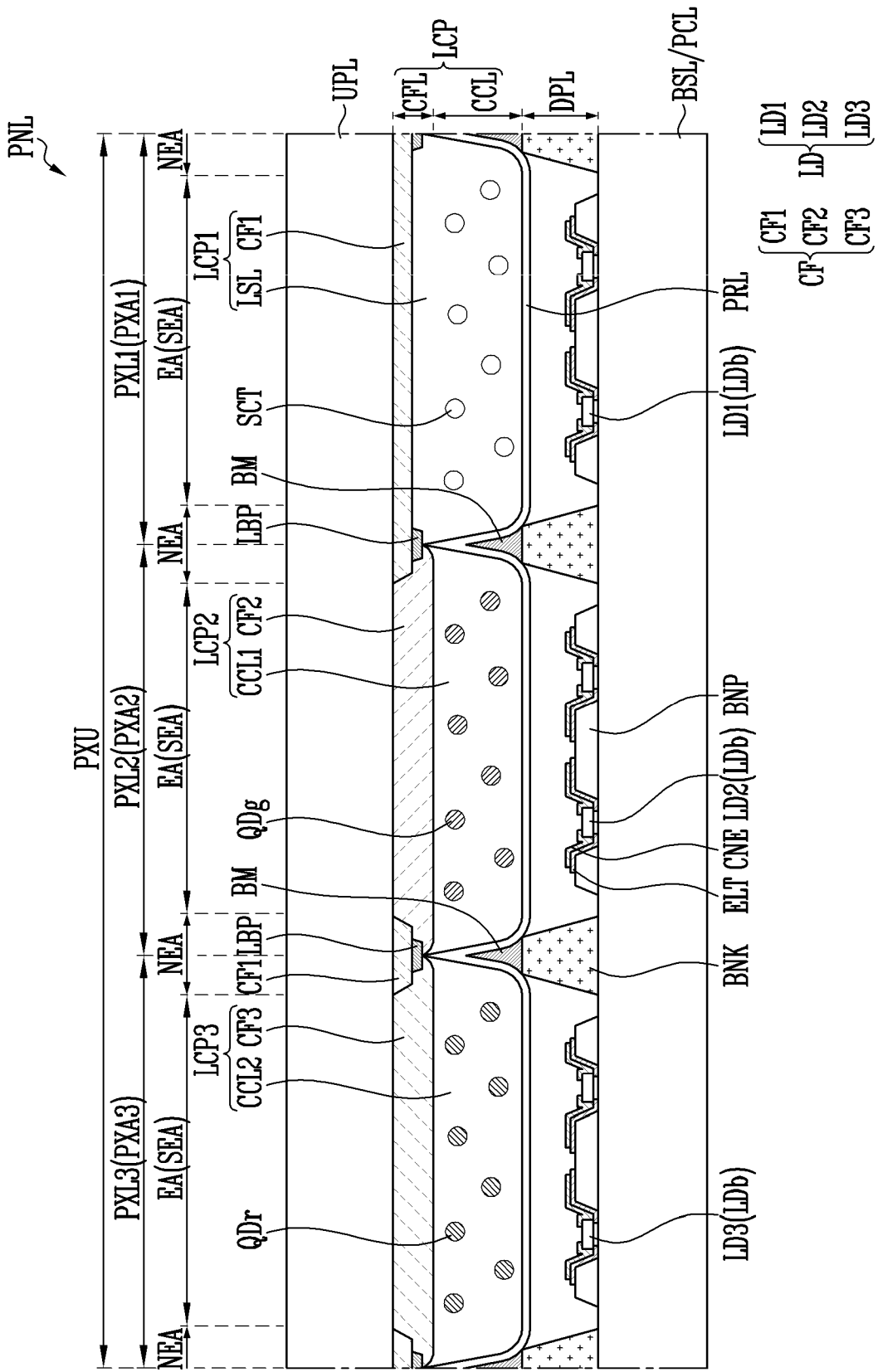
Figure 16A:
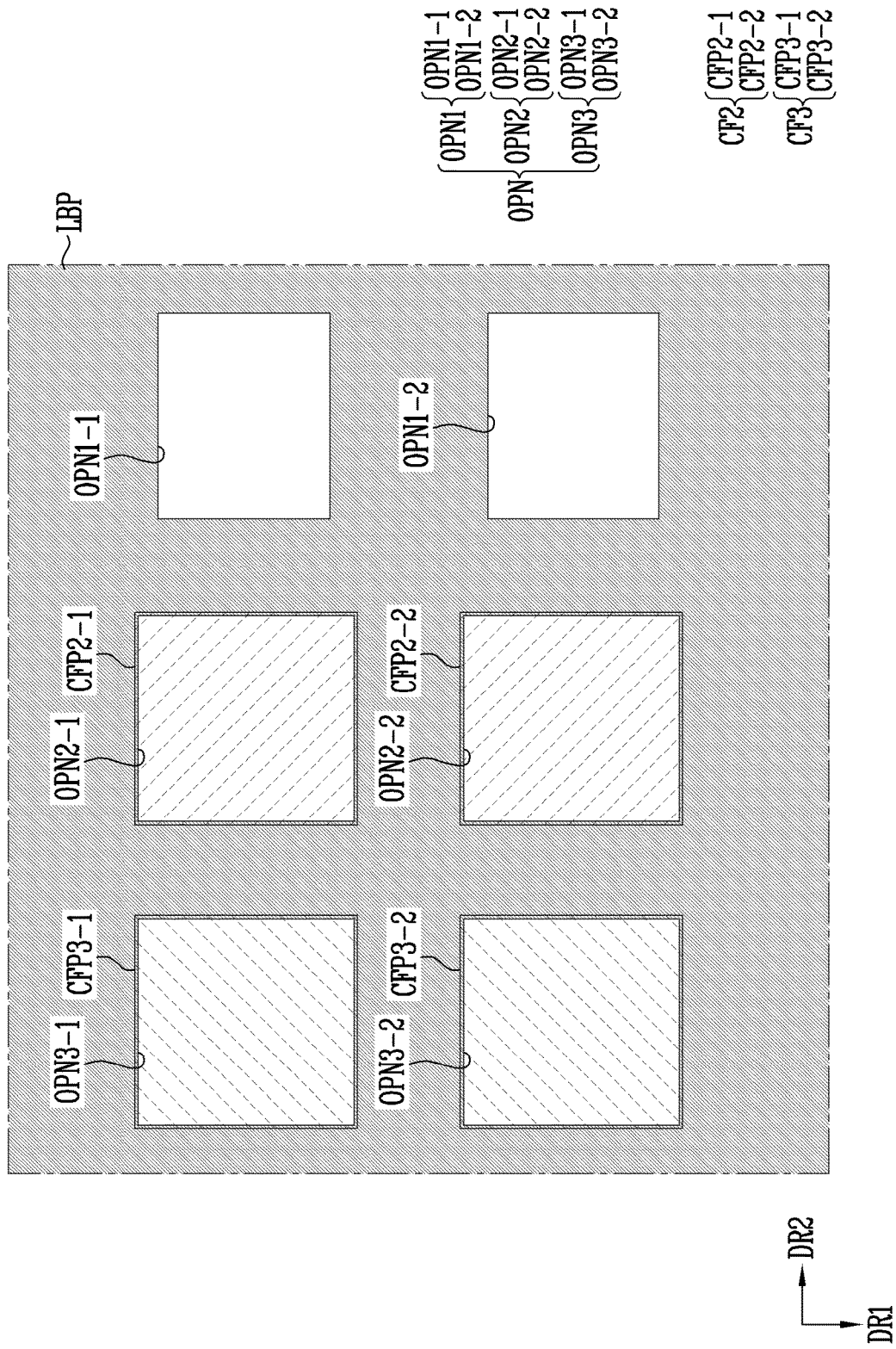
FIGS. 16A and 16B are plan views illustrating a light blocking pattern and a color filter of a display device according to an embodiment of the present disclosure.
Figure 16B:
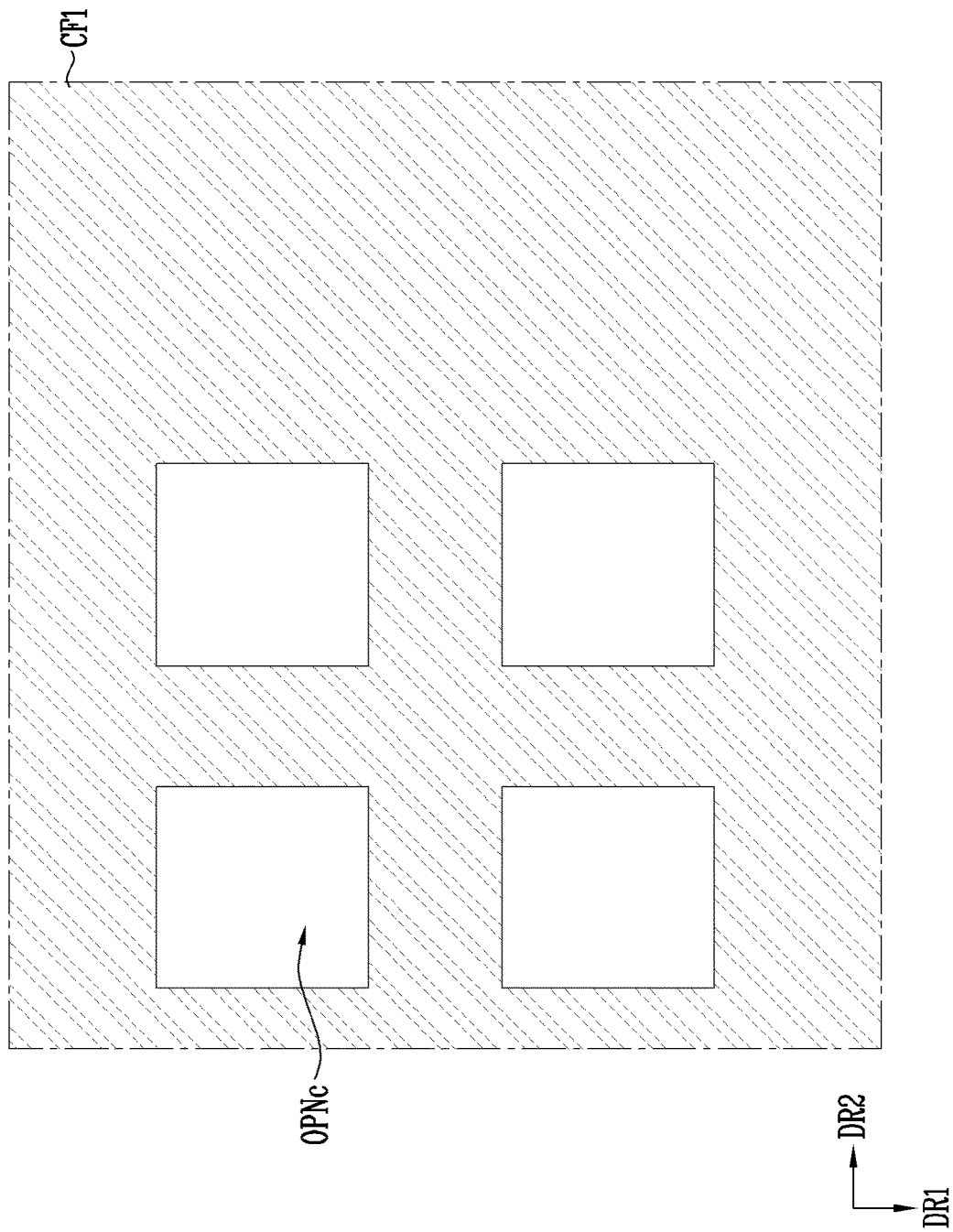

FIGS. 16A and 16B are plan views illustrating a light blocking pattern LBP and a color filter CF of a display device according to an embodiment of the present disclosure. As an example, FIG. 16A illustrates an embodiment of a light blocking pattern LBP and second and third color filters CF2 and CF3 disposed on the display panel PNL of FIG. 15, and FIG. 16B illustrates an embodiment of a first color filter CF1 disposed on the display panel PNL of FIG. 15. The first color filter CF1 includes openings OPNc that correspond to second and third color filters CF2 and CF3.

In the embodiments of FIGS. 11-16B, components similar or identical to those of the above-described embodiments are denoted by the same reference numerals, and detailed descriptions thereof will be omitted.

First, referring to FIGS. 3-11, the light-emitting unit EMU of each pixel PXL may be disposed on a display layer DPL on a base layer BSL and/or a circuit layer PCL. For example, the light-emitting unit EMU of the corresponding pixel PXL may be disposed in each emission area EA (or sub-emission areas SEA constituting the emission area EA) of the display layer DPL. For example, in each emission area EA, the above-described bank pattern BNP, pixel electrodes ELT, light-emitting elements LD, and contact electrodes CNE may be disposed, and one or more insulating layers (for example, first, second, third, and/or fourth insulating layers INS1, INS2, INS3, and INS4) may be further disposed. An overcoat layer or a filler layer may be selectively further disposed on the fourth insulating layer INS4. The structure of the light-emitting unit EMU may be variously changed according to embodiments.

A bank BNK surrounding each of the emission areas EA and/or the sub-emission areas SEA may be disposed between the adjacent emission areas EA and/or between adjacent sub-emission areas SEA.

In an embodiment, the first, second, and third pixels PXL1, PXL2, and PXL3 may include the light-emitting elements LD that emit light having different colors. For example, the first, second, and third pixels PXL1, PXL2, and PXL3 may respectively include first light-emitting elements LD1, second light-emitting elements LD2, and third light-emitting elements LD3. The first light-emitting elements LD1, the second light-emitting elements LD2, and the third light-emitting elements LD3 may emit first color light, second color light, and third color light, respectively. As an example, the first light-emitting elements LD1 may be blue light-emitting elements LDb that emit blue light, the second light-emitting elements LD2 are green light-emitting elements LDg that emit green light, and the third light-emitting elements LD3 may be red light-emitting elements LDr that emit red light.

According to some embodiments, an upper substrate UPL may be disposed on the pixels PXL. For example, the upper substrate UPL (also referred to as "encapsulation substrate" or "color filter substrate") encapsulating a display area DA may be disposed on one surface of the base layer BSL on which the pixels PXL are disposed.

The upper substrate UPL may be a rigid or flexible substrate (or film). In an embodiment, when the upper substrate UPL is the rigid substrate, the upper substrate UPL may be one of a glass substrate, a quartz substrate, a glass ceramic substrate, and a crystalline glass substrate. In another embodiment, when the upper substrate UPL is the flexible substrate, the upper substrate UPL may be one of a film substrate and a plastic substrate including a polymer organic material. Further, the upper substrate UPL may include fiber glass reinforced plastic (FRP).

The upper substrate UPL may selectively include a light control layer LCP overlapping the pixels PXL. As an example, the light control layer LCP including a color filter layer CFL may be disposed on one surface of the upper substrate UPL facing the pixels PXL.

The color filter layer CFL may include a color filter CF corresponding to a color of each pixel PXL. For example, the color filter layer CFL may include the first color filter CF1 disposed on the first pixel PXL1 to selectively transmit light generated in the first pixel PXL1, a second color filter CF2 disposed on the second pixel PXL2 to selectively transmit light generated in the second pixel PXL2, and a third color filter CF3 disposed on the third pixel PXL3 to selectively transmit light generated in the third pixel PXL3. In an embodiment, the first color filter CF1, the second color filter CF2, and the third color filter CF3 may be a blue color filter, a green color filter, and a red color filter, respectively but are not limited thereto.

The first color filter CF1 may be disposed between the first pixel PXL1 and the upper substrate UPL and may include a color filter material that selectively transmits first color light generated in the first pixel PXL1. For example, when the first pixel PXL1 is a blue pixel, the first color filter CF1 may include a blue color filter material.

The second color filter CF2 may be disposed between the second pixel PXL2 and the upper substrate UPL and may include a color filter material that selectively transmits second color light generated in the second pixel PXL2. For example, when the second pixel PXL2 is a green pixel, the second color filter CF2 may include a green color filter material.

The third color filter CF3 may be disposed between the third pixel PXL3 and the upper substrate UPL and may include a color filter material that selectively transmits third color light generated in the third pixel PXL3. For example, when the third pixel PXL3 is a red pixel, the third color filter CF3 may include a red color filter material.

The light blocking pattern LBP may be disposed between the color filters CF. For example, the light blocking pattern LBP may be disposed on one surface of the upper substrate UPL to face the bank BNK and may overlap an edge of each of the first to third color filters CF1, CF2, and CF3. The light blocking pattern LBP may be opened in an area corresponding to each emission area EA and/or each sub-emission area SEA.

The light blocking pattern LBP may include at least one black matrix material (for example, at least one light blocking material currently known) selected from various types of black matrix materials, and/or a color filter material of a specific color. Further, the light blocking pattern LBP may be made of the same material as the bank BNK, but the present disclosure is not limited thereto. That is, the light blocking pattern LBP and the bank BNK may include the same material or different materials.

In an embodiment, in order for light emitted from the light-emitting elements LD to be smoothly emitted in an upward direction of the pixels PXL, a filler (e.g., a set or predetermined filler) having a relatively low refractive index may fill a space between a lower plate of the display panel PNL including the base layer BSL and the display layer DPL and an upper plate of the display panel PNL including the upper substrate UPL and the light control layer LCP. In another embodiment, the space between the lower plate and the upper plate of the display panel PNL may be filled with an air layer.

While FIG. 11 illustrates the embodiment in which the upper substrate UPL is disposed on the base layer BSL on which the pixels PXL are disposed, the present disclosure is not limited thereto. For example, the color filters CF and the light blocking pattern LBP may be formed on one surface of the base layer BSL on which the pixels PXL are disposed, and one surface of the base layer BSL may be sealed using a thin film encapsulation layer or the like.

Figure 12:
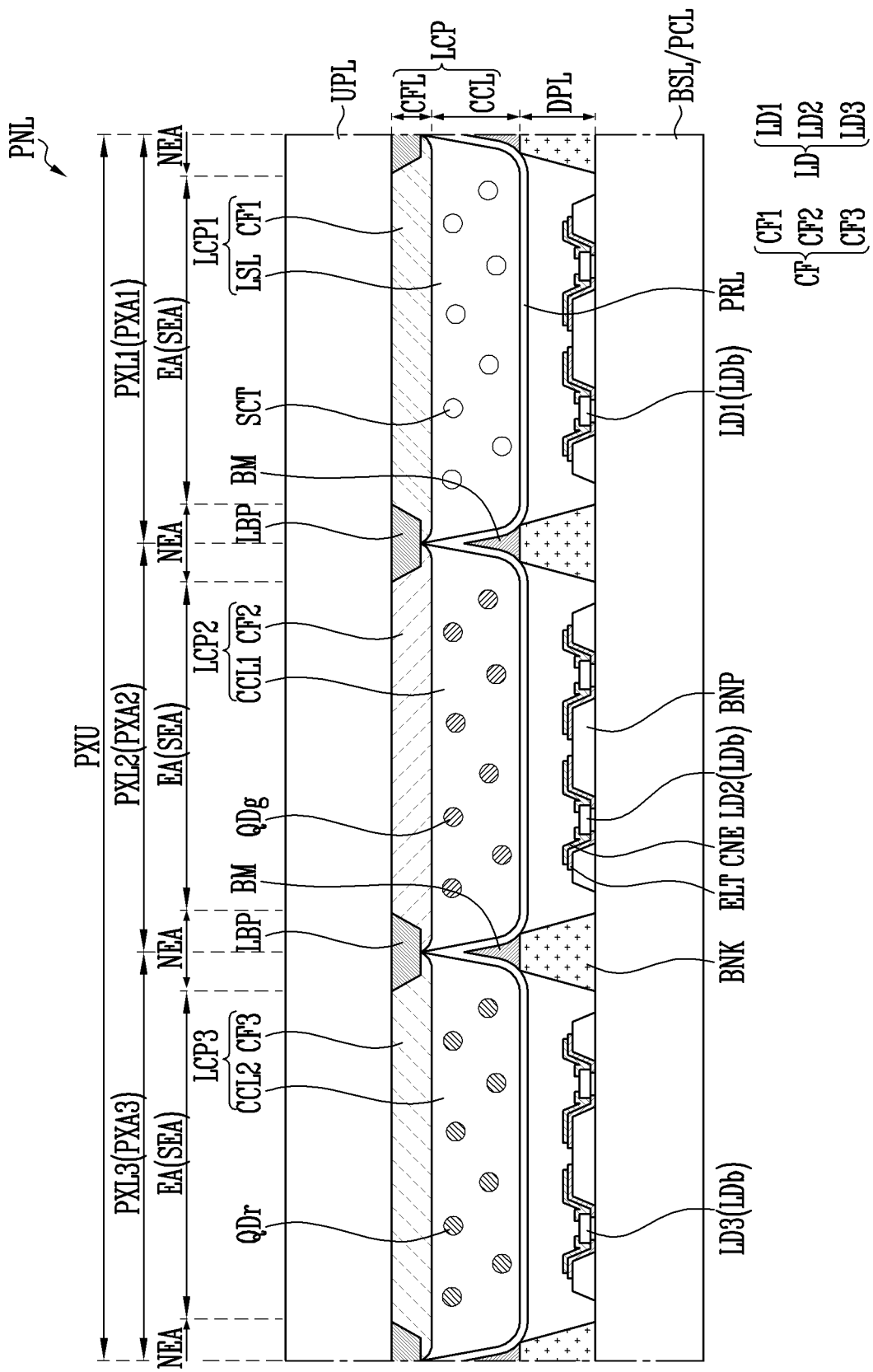

Referring to FIG. 12, the first to third pixels PXL1, PXL2, and PXL3 may include the light-emitting elements LD that emit light having the same color light. For example, the first, second, and third pixels PXL1, PXL2, and PXL3 may respectively include first light-emitting elements LD1, second light-emitting elements LD2, and third light-emitting elements LD3. The first light-emitting elements LD1, the second light-emitting elements LD2, and the third light-emitting elements LD3 may all emit first color light. As an example, the first, second, and third pixels PXL1, PXL2, and PXL3 may be the blue light-emitting elements LDb that emit blue light at a wavelength of about 400 nm to 500 nm.

In this case, a color conversion layer CCL including at least one type of color conversion particles may be disposed on at least some pixels PXL from among the first, second, and third pixels PXL1, PXL2, and PXL3. Accordingly, the display device according to the embodiment of the present disclosure can display a full-color image.

For example, the light control layer LCP including the color filter layer CFL and/or the color conversion layer CCL disposed on one surface of the upper substrate UPL to face the pixels PXL. The color conversion layer CCL may be disposed between the color filter layer CFL and the pixels PXL and may include color conversion particles.

For example, the light control layer LCP may include a first light control layer LCP1 disposed on the first pixel PXL1, a second light control layer LCP2 disposed on the second pixel PXL2, and a third light control layer LCP3 disposed on the pixel PXL3. Each of the first, second, and third light control layers LCP1, LCP2, and LCP3 may include the color conversion layer CCL and/or the color filter CF that correspond to a suitable color (e.g., a set or predetermined color).

For example, the first light control layer LCP1 may include at least one of a light scattering layer LSL that includes light scattering particles SCT and the first color filter CF1 that selectively transmits first color light. The second light control layer LCP2 may include at least one of a first color conversion layer CCL1 that includes first color conversion particles corresponding to second color light and the second color filter CF2 that selectively transmits the second color light. Similarly, the third light control layer LCP3 may include at least one of a second color conversion layer CCL2 that includes second color conversion particles corresponding to third color light and the third color filter CF3 that selectively transmits the third color light.

In an embodiment, the light scattering layer LSL, the first color conversion layer CCL1, and the second color conversion layer CCL2 may be formed on one surface of the upper substrate UPL on which the first to third color filters CF1 to CF3 and the light blocking pattern LBP are disposed. Further, a protective layer PRL may be disposed on surfaces of the light scattering layer LSL, the first color conversion layer CCL1, and the second color conversion layer CCL2.

According to some embodiments, a pattern capable of blocking light may be additionally disposed between the light scattering layer LSL, the first color conversion layer CCL1, and the second color conversion layer CCL2. For example, a black matrix pattern BM may be disposed between the light scattering layer LSL, the first color conversion layer CCL1, and the second color conversion layer CCL2.

The black matrix pattern BM may include at least one black matrix material (for example, at least one light blocking material currently known) selected from various types of black matrix materials, and/or a color filter material having a specific color. Further, the black matrix pattern BM may be made of the same material as the bank BNK and/or the light blocking pattern LBP, but the present disclosure is not limited thereto. That is, the black matrix pattern BM, the bank BNK, and/or the light blocking pattern LBP may include the same material or different materials.

In the embodiment of FIG. 12, the display panel PNL is illustrated as having a structure in which the light scattering layer LSL, the first color conversion layer CCL1, and the second color conversion layer CCL2 are first formed on one surface of the upper substrate UPL, and then, the black matrix pattern BM is formed between the light scattering layer LSL, the first color conversion layer CCL1, and the second color conversion layer CCL2, but the order of forming the black matrix pattern BM may be changed. For example, the black matrix pattern BM may be first formed on one surface of the upper substrate UPL on which the color filter CF and the like are disposed, and the light scattering layer LSL, the first color conversion layer CCL1, and/or the second color conversion layer CCL2 may be formed in areas partitioned by the black matrix pattern BM.

As an example, the black matrix pattern BM may be first formed, and then, the light scattering layer LSL, the first color conversion layer CCL1, and/or the second color conversion layer CCL2 may be formed in the areas partitioned by the black matrix pattern BM through an inkjet method or the like. Alternatively, when there is no need to first form the black matrix pattern BM according to a process method and/or performance of a printing facility, the scattering layer LSL, the first color conversion layer CCL1, and the second color conversion layer CCL2 may be first formed, and then, the black matrix pattern BM may be formed. That is, the order of forming the light scattering layer LSL, the first color conversion layer CCL1, the second color conversion layer CCL2, and/or the black matrix pattern BM and/or the position or shape thereof according to the order may be variously changed according to embodiments. Further, the display panel PNL may or may not include the black matrix pattern BM between the light scattering layer LSL, the first color conversion layer CCL1, and/or the second color conversion layer CCL2.

The light scattering layer LSL may be disposed on the first pixel PXL1. As an example, the light scattering layer LSL may be disposed between the first light-emitting elements LD1 and the first color filter CF1. The light scattering layer LSL may be omitted according to some embodiments.

According to some embodiments, when the first light-emitting elements LD1 disposed in the first pixel PXL1 are the blue light-emitting elements LDb configured to emit blue light and the first pixel PXL1 is the blue pixel, the light scattering layer LSL may be selectively provided in order to efficiently utilize light emitted from the blue light-emitting elements LDb. The light scattering layer LSL may include at least one type of the light scattering particles SCT. In this case, the first color filter CF1 may be the blue color filter.

For example, the light scattering layer LSL may include the plurality of light scattering particles SCT dispersed in a matrix material (e.g., a set or predetermined matrix material). As an example, the light-scattering layer LSL may include the light scattering particles SCT of titanium oxide ($Ti_xO_y$) such as titanium dioxide ($TiO_2$), silica, or the like, but the present disclosure is not limited thereto. The light scattering particles SCT do not have to be disposed only on the first pixel PXL1. As an example, the first and/or second color conversion layers CCL1 and CCL2 may also selectively include the light scattering particles SCT.

Further, in the present disclosure, the light scattering layer LSL is not limited to including only a transmission layer and/or a scattering layer for transmitting and scattering light. For example, the light scattering layer LSL may also include at least one type of color conversion particles according to embodiments. For example, the light scattering layer LSL may include blue quantum dots.

The first color conversion layer CCL1 may be disposed on the second pixel PXL2 to convert first color light emitted from the second light-emitting elements LD2 into second color light. To this end, the first color conversion layer CCL1 may be disposed between the second light-emitting elements LD2 and the second color filter CF2 and may include the first color conversion particles. As an example, when the second light-emitting elements LD2 disposed in the second pixel PXL2 are the blue light-emitting elements LDb that emits blue light and the second pixel PXL2 is the green pixel, the first color conversion layer CCL1 may include the green quantum dots QDg that convert the blue light emitted from the blue light-emitting element LDb into green light. For example, the first color conversion layer CCL1 may include the plurality of green color quantum dots QDg dispersed in a matrix material (e.g., a set or predetermined matrix material) such as a transparent resin. In this case, the second color filter CF2 may be the green color filter.

The green quantum dots QDg may absorb blue light and shift a wavelength according to an energy transition to emit green light at a wavelength of about 500 nm to 570 nm. When the second pixel PXL2 is a different color pixel, the first color conversion layer CCL1 may include first quantum dots corresponding to a color of the second pixel PXL2.

Further, the first color conversion layer CCL1 may selectively include at least one type of light scattering particles. For example, the first color conversion layer CCL1 may further include light scattering particles of a type and/or material that are the same as or different from those of the light scattering particles SCT included in the light scattering layer LSL.

The second color conversion layer CCL2 may be disposed on the third pixel PXL3 to convert first color light emitted from the third light-emitting elements LD3 into third color light. To this end, the second color conversion layer CCL2 may be disposed between the third light-emitting elements LD3 and the third color filter CF3 and may include second color conversion particles. As an example, when the third light-emitting elements LD3 disposed in the third pixel PXL are the blue light-emitting elements LDb that emits blue light and the third pixel PXL3 is the red pixel, the second color conversion layer CCL2 may include the red quantum dots QDr that convert the blue light emitted from the blue light-emitting elements LDb into red light. In this case, the third color filter CF3 may be the red color filter.

For example, the second color conversion layer CCL2 may include the plurality of red color quantum dots QDr dispersed in a matrix material (e.g., a set or predetermined matrix material) such as a transparent resin. The red color quantum dots QDr may absorb blue light and shift a wavelength according to an energy transition to emit red light at a wavelength of about 620 nm to 780 nm. When the third pixel PXL3 is a different color pixel, the second color conversion layer CCL2 may include the second quantum dots corresponding to a color of the third pixel PXL3.

Furthermore, the second color conversion layer CCL2 may selectively include at least one type of light scattering particles. For example, the second color conversion layer CCL2 may further include light scattering particles of a type and/or material that are the same as or different from those of the light scattering particles SCT included in the light scattering layer LSL.

In an embodiment of the present disclosure, blue light having a relatively short wavelength in a visible light region may be incident on each of the green quantum dots QDg and the red quantum dots QDr, thereby increasing an absorption coefficient of the green quantum dots QDg and the red quantum dots QDr. Accordingly, finally, efficiency of light emitted from the second and third pixels PXL2 and PXL3 can be increased, and excellent color reproducibility can also be secured. Further, when the light-emitting units EMU of the first, second, and third pixels PXL1, PXL2, and PXL3 are formed using the same color light-emitting elements LD (for example, the blue light-emitting elements LDb), it is possible to increase the manufacturing efficiency of the display device.

According to the embodiment of FIG. 12, pixels PXL and a display device including the same can be easily manufactured using light-emitting elements LD having a single color (for example, the blue light-emitting elements LDb). Further, the color conversion layer CCL may be disposed on at least some of the pixels PXL, thereby manufacturing a full-color pixel unit PXU and a display device including the same.

Figure 13:
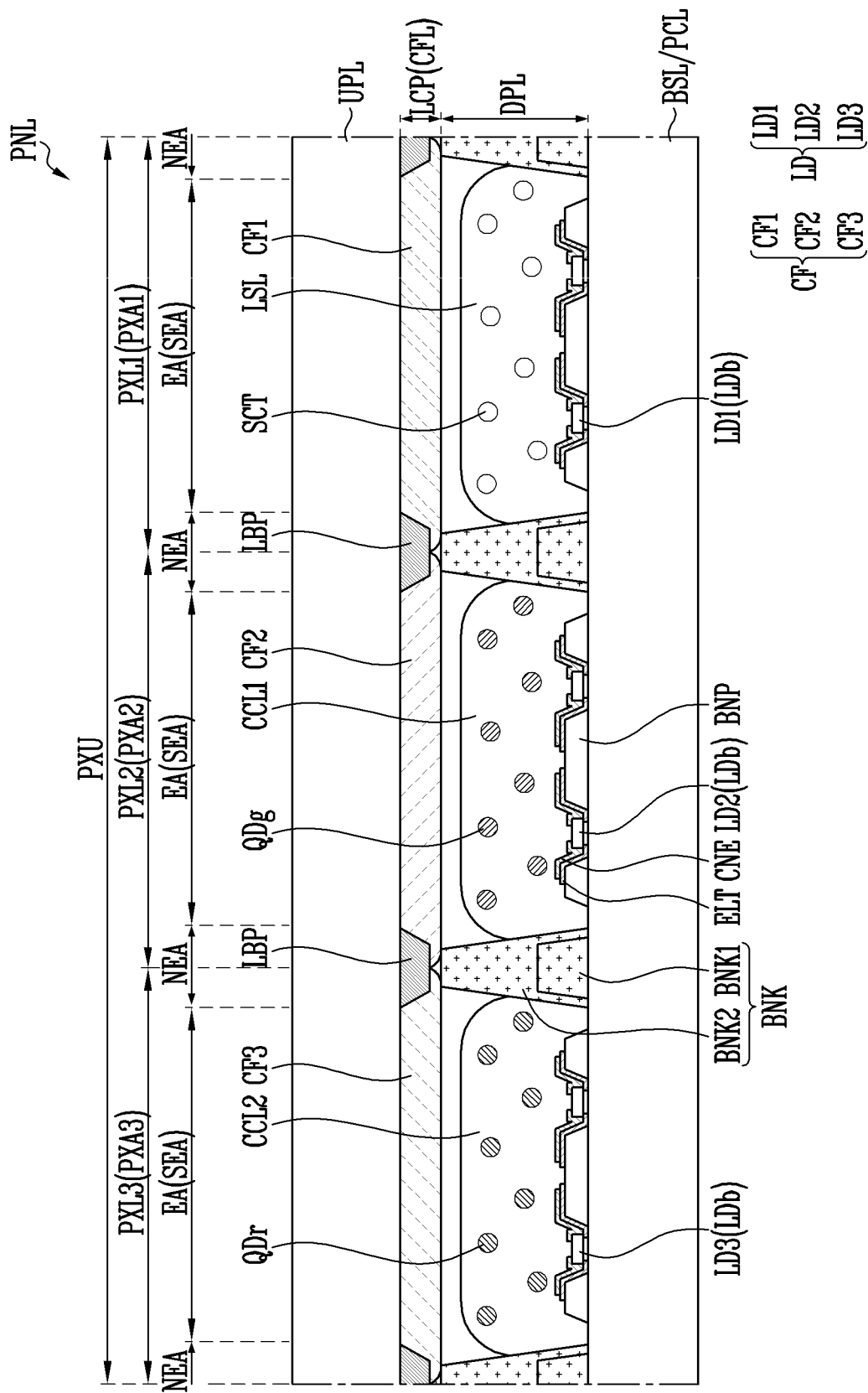

Referring to FIG. 13, the light scattering layer LSL, the first color conversion layer CCL1, and the second color conversion layer CCL2 may be formed directly on one surface of the base layer BSL on which the pixels PXL are formed. For example, the light scattering layer LSL, the first color conversion layer CCL1, and the second color conversion layer CCL2 may each be formed on one surface of the base layer BSL so as to cover the emission areas EA of the first, second, and third pixels PXL1, PXL2, and PXL3 in which the first, second, and third light-emitting elements LD1, LD2, LD3 are disposed. Even in the embodiment of FIG. 13, at least one protective layer may be formed on the surfaces of the light scattering layer LSL, the first color conversion layer CCL1, and the second color conversion layer CCL2.

In an embodiment, the bank BNK may be formed to be higher so as to partition areas in which the light scattering layer LSL, the first color conversion layer CCL1, and the second color conversion layer CCL2 are formed. In another embodiment, the bank BNK may be formed to have a height sufficient to partition areas to which the first to third light-emitting elements LD1, LD2, and LD3 are to be supplied, and an additional bank pattern may be formed on the bank BNK. For example, the bank BNK may include a first bank BNK1 and a second bank BNK2 formed to overlap the first bank BNK1. That is, the bank BNK may be formed as a single-layer or multi-layer, and the structure, position, and/or height thereof may be variously changed.

Each of the first and second banks BNK1 and BNK2 may include at least one black matrix material (for example, at least one light blocking material currently known) selected from various types of black matrix materials, and/or a color filter material of a specific color. For example, each of the first and second banks BNK1 and BNK2 may be formed in a black opaque pattern to block light transmission. Further, the first and second banks BNK1 and BNK2 may contain the same material or different materials.

The first, second, and third color filters CF1, CF2, and CF3 may be disposed on the upper substrate UPL. For example, the first, second, and third color filters CF1, CF2, and CF3 may be disposed on one surface of the upper substrate UPL so as to face the light scattering layer LSL, the first color conversion layer CCL1, and the second color conversion layer CCL2, respectively.

Figure 14:
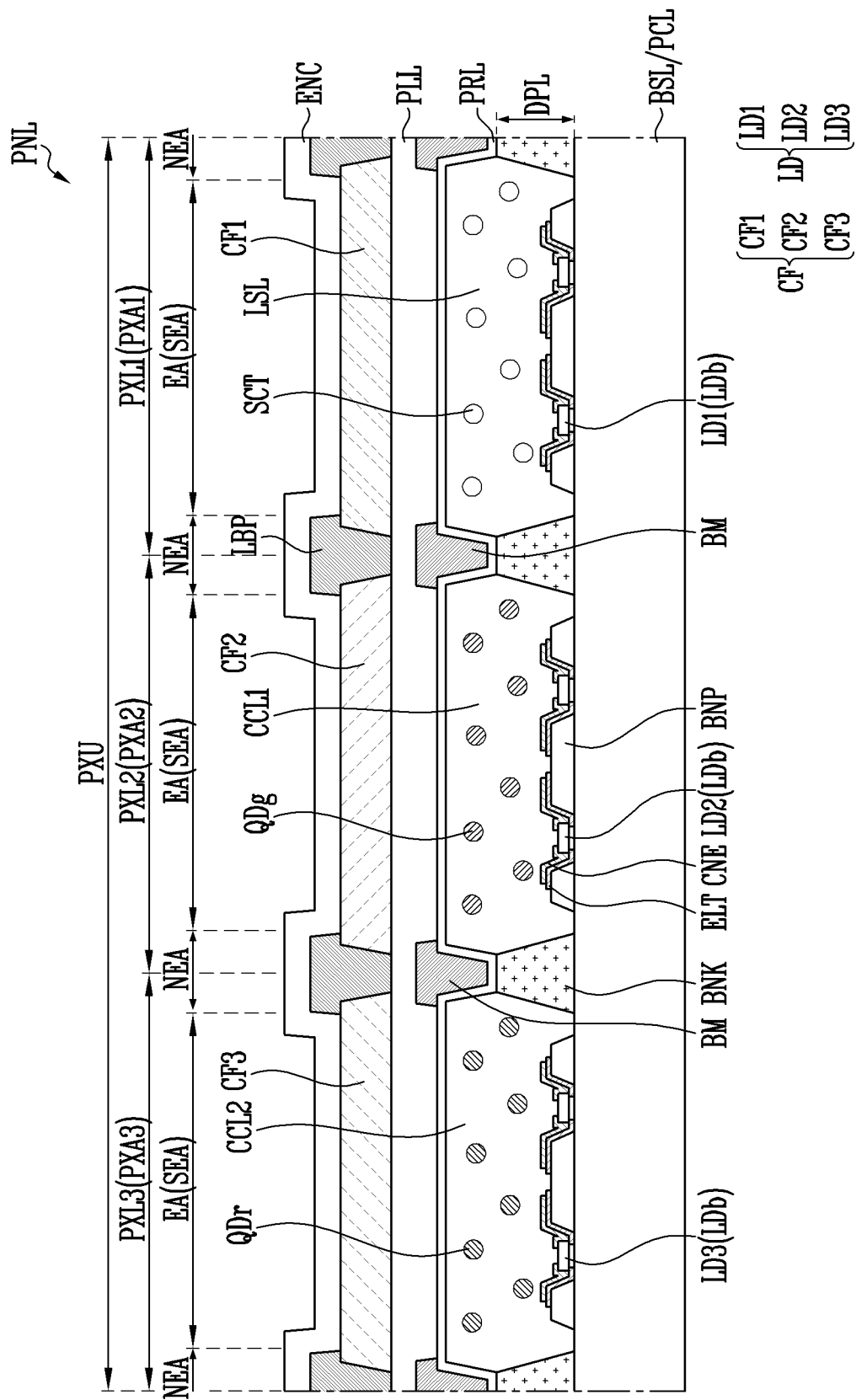

Referring to FIG. 14, the light scattering layer LSL, the first color conversion layer CCL1, the second color conversion layer CCL2, the first to third color filters CF1 to CF3, and the light blocking pattern LBP may all be formed on one surface of the base layer BSL. For example, the light scattering layer LSL, the first color conversion layer CCL1, and the second color conversion layer CCL2 may be formed on one surface of the base layer BSL on which the first to third light-emitting elements LD1 to LD3 are disposed, and a planarization film PLL may be formed on the light scattering layer LSL, the first color conversion layer CCL1, and the second color conversion layer CCL2.

According to some embodiments, the planarization film PLL may be formed as a single-layer or multi-layer including at least one layer of an organic film. For example, the planarization film PLL may include a low refractive organic layer, and thus, luminous efficiency of the pixel PXL may be secured.

The first to third color filters CF1 to CF3 and the light blocking pattern LBP may be formed on one surface of the base layer BSL on which the planarization film PLL is disposed. Thereafter, an encapsulation layer ENC may be formed to cover one surface of the base layer BSL on which the first to third color filters CF1 to CF3 and the light blocking pattern LBP are disposed, thereby sealing the display area DA.

In an embodiment, the encapsulation layer ENC may be formed as a single-layer or multi-layer including at least one layer of an organic film and/or inorganic film. For example, the encapsulation layer ENC may be formed as a multi-layer including at least one layer of an inorganic film disposed on one surface of the base layer BSL on which the first to third color filters CF1 to CF3 and the light blocking pattern LBP are disposed, and at least one layer of an organic film stacked on the inorganic film. Further, the encapsulation layer ENC may selectively further include at least one layer of an inorganic film disposed on the organic film. However, the structure of the encapsulation layer ENC is not limited thereto. For example, in another embodiment, the encapsulation layer ENC may be formed only as a multi-layer of inorganic films. That is, the structural material and/or structure of the encapsulation layer ENC may be variously changed according to embodiments.

In at least an embodiment including the embodiment of FIG. 14, the order of forming the light scattering layer LSL, the first color conversion layer CCL1 the second color conversion layer CCL2, and the black matrix pattern BM, the shape thereof according to the order, and/or whether to form the black matrix pattern BM may be variously changed according to embodiments. For example, when it is assumed that the light scattering layer LSL, the first color conversion layer CCL1, and/or the second color conversion layer CCL2 are formed through an inkjet method, according to performance of an inkjet facility, the black matrix pattern BM may be first formed, or the light scattering layer LSL, the first color conversion layer CCL1, and/or the second color conversion layer CCL2 may be formed without forming the black matrix pattern BM. As an example, the display panel PNL may or may not include the black matrix pattern BM (or bank BNK) between the light scattering layer LSL, the first color conversion layer CCL1, and/or the second color conversion layer CCL2. According to some embodiments, the bank BNK and the black matrix pattern BM may be integrated.

Similarly, the order of forming the first to third color filters CF1 to CF3 and the light blocking pattern LBP and/or the shape thereof according to the order may be variously changed according to embodiments. For example, the order of forming the first to third color filters CF1 to CF3 and the light blocking pattern and/or the shape thereof according to the order may vary according to a method of forming the first to third color filters CF1 to CF3.

According to the embodiments of FIGS. 13 and 14, the light scattering layer LSL, the first color conversion layer CCL1, and the second color conversion layer CCL2 may be formed directly on one surface of the base layer BSL on which the first, second, and third light-emitting elements LD1, LD2, and LD3 are disposed, thereby improving luminous efficiency of the pixels PXL.

As in the embodiments of FIGS. 12-14, in some embodiments including the first color conversion layer CCL1, the second color conversion layer CCL2, and the light scattering layer LSL, the first color conversion layer CCL1, the second color conversion layer CCL2, and/or the light scattering layer LSL may be separated into a plurality of patterns on each pixel PXL so as to correspond to the plurality of sub-emission areas SEA in the same manner as in the color filter CF. For example, the black matrix pattern BM and/or the second bank BNK2 may include a plurality of openings separated on each pixel PXL so as to correspond to the plurality of sub-emission areas SEA like the light blocking pattern LBP. The color conversion layer CCL having a suitable color (e.g., a set or predetermined color) and the scattering layer LSL, which are separated into the plurality of patterns so as to correspond to the sub-emission areas SEA, may be disposed in the openings of the black matrix pattern BM and/or the second bank BNK2.

Referring to FIGS. 15-16B, the first color filter CF1 may be disposed on the first pixel PXL1 and may also be disposed between the emission areas EA and the sub-emission areas SEA of the first, second, and third pixels PXL1, PXL2, and PXL3. For example, the first color filter CF1 may also be disposed in the non-emission area NEA between the sub-emission areas SEA of the first, second, and third pixels PXL1, PXL2, and PXL3 so as to overlap the light blocking pattern LBP.

In this case, the first color filter CF1 may include a plurality of openings OPN opened in areas in which the second and third color filters CF2 and CF3 are disposed, for example, areas corresponding to the second and third openings OPN2 and OPN3 of the light blocking pattern LBP. Further, the first color filter CF1 may overlap the light blocking pattern LBP in the non-emission area NEA. As an example, in the non-emission area NEA, the first color filter CF1 may be disposed between the upper substrate UPL and the light blocking pattern LBP.

While, a modified embodiment of the embodiment of FIG. 12 is illustrated in FIG. 15, in the embodiments of FIGS. 11, 13, and 14, the first color filter CF1 may also be disposed in the non-emission area NEA in the same or similar manner.

According to the embodiments of FIGS. 15-16B, the first color filter CF1 and the light blocking pattern LBP may be allowed to overlap each other in the non-emission area NEA, thereby reinforcing the light blocking layer. Accordingly, the reflection of external light can be more effectively blocked.

Additionally, even in the embodiments of FIGS. 15-16B, the first color conversion layer CCL1, the second color conversion layer CCL2, and/or the light scattering layer LSL may be separated into a plurality of patterns on each pixel PXL so as to correspond to the plurality of emission areas SEA. For example, the black matrix pattern BM may include a plurality of openings separated on each pixel PXL so as to correspond to the plurality of sub-emission areas SEA like the light blocking pattern LBP. The color conversion layer CCL having a color (e.g., a set or predetermined color) and the scattering layer LSL, which are separated into the plurality of patterns so as to correspond to the sub-emission areas SEA, may be disposed in the openings of the black matrix pattern BM.

While embodiments in which the first, second, and third pixels PXL1, PXL2, and PXL3 include the light-emitting elements LD that emit the same color light, and the color conversion layer CCL is provided on the first, second, and third pixels PXL1, PXL2, and PXL3 have been described in reference to FIGS. 12-16B, the present disclosure is not limited thereto. For example, even when the first, second, and third pixels PXL1, PXL2, and PXL3 include the light-emitting elements LD having different colors as in the embodiment of FIG. 11, the color conversion layer CCL including at least one type of color conversion particles may be selectively provided on the first, second, and/or third pixels PXL1, PXL2, and PXL3. As an example, even when the first, second, and third pixels PXL1, PXL2, and PXL3 respectively include the blue, green, and red light-emitting elements LDb, LDg, and LDr, the light scattering layer LSL (and/or blue color conversion layer) and the first color filter CF1 may be disposed on the first pixel PXL1, the first color conversion layer CCL1 and the second color filter CF2 may be disposed on the second pixel PXL2, and the second color conversion layer CCL2 and the third color filter CF3 may be disposed on the third pixel PXL3. Further, in describing the embodiments of the present disclosure, the color conversion layer CCL and/or the color filter CF being provided on each pixel PXL is defined assuming that an emission direction of light generated from the pixel PXL is set to an upward direction. That is, the term "on" of the pixel PXL is based on a direction and/or path in which light is emitted from the pixel PXL, and the position of the color conversion layer CCL and/or the color filter CF may be interpreted differently according to a reference direction. For example, the color conversion layer CCL and/or the color filter CF may be provided in a path through which light is emitted from the light-emitting elements LD of each pixel PXL, and the position thereof may be changed.

According to a display device according to various embodiments of the present disclosure, a light blocking pattern is efficiently opened in accordance with an emission area of each pixel, thereby reducing the reflectance of external light and also securing the luminous efficiency of a pixel. Accordingly, the image quality of the display device can be improved.

The technical spirit of the preset disclosure has been specifically described according to the embodiments, but it is to be noted that the embodiments are provided for the description thereof and are not for the limitation thereof. Furthermore, those skilled in the art will appreciate that various modifications may be made without departing from the scope and spirit of the present disclosure.

The scope of the present disclosure is not limited to the detailed description but should be defined by the claims. Further, it shall be understood that all modifications and embodiments conceived from the meaning and scope of the claims and their equivalents are included in the scope of the present disclosure.

What is claimed is:

1. A display device comprising:
   a first pixel including a first sub-emission area and a second sub-emission area that are spaced from each other, and first light-emitting elements in the first and second sub-emission areas, the first light-emitting elements being configured to emit light having a first color;
   a light blocking pattern on the first pixel to cover an area between the first sub-emission area and the second sub-emission area and including a plurality of openings respectively corresponding to the first and second sub-emission areas;
   a first color filter comprising a plurality of first color filter patterns on the first and second sub-emission areas, the plurality of first color filter patterns being configured to transmit a first color light; and
   a bank surrounding an emission area of the first pixel including the first and second sub-emission areas,
   wherein the first pixel comprises:
      a first electrode and a second electrode in the first sub-emission area;
      at least one of the first light-emitting elements in the first sub-emission area and connected between the first electrode and the second electrode;
      a third electrode and a fourth electrode in the second sub-emission area;
      at least one of the first light-emitting elements in the second sub-emission area and connected between the third electrode and the fourth electrode; and
      at least one contact electrode configured to connect any one of the first and second electrodes and any one of the third and fourth electrodes.

2. The display device of claim 1, wherein the first color filter patterns are separated from each other with the light blocking pattern interposed therebetween.

3. The display device of claim 1, wherein at least one of the first light-emitting elements in the first sub-emission area and at least one of the first light-emitting elements in the second sub-emission area are connected in series.

4. The display device of claim 1, wherein at least a portion of the bank is located between the first sub-emission area and the second sub-emission area and includes an opening exposing an area between the first sub-emission area and the second sub-emission area.

5. The display device of claim 1, wherein the bank includes openings corresponding to areas including the first and second sub-emission areas and a non-emission area between the first sub-emission area and the second sub-emission area.

6. The display device of claim 1, wherein the first color filter is a color filter corresponding to the first color.

7. The display device of claim 6, further comprising:
a second pixel adjacent to the first pixel and including a first sub-emission area and a second sub-emission area that are spaced from each other, and second light-emitting elements in the first and second sub-emission areas and configured to emit a same color light; and
a third pixel adjacent to the second pixel and including a first sub-emission area and a second sub-emission area that are spaced from each other, and third light-emitting elements in the first and second sub-emission areas, and configured to emit a same color light.

8. The display device of claim 7, further comprising:
a second color filter comprising second color filter patterns corresponding to a second color, the second color filter patterns being on the first and second sub-emission areas of the second pixel and being spaced from each other with the light blocking pattern interposed therebetween; and
a third color filter comprising third color filter patterns corresponding to a third color, the third color filter patterns being on the first and second sub-emission areas of the third pixel and being spaced from each other with the light blocking pattern interposed therebetween.

9. The display device of claim 8, wherein the light blocking pattern is on the first to third pixels and overlapping non-emission areas between the first sub-emission areas and the second sub-emission areas of the first to third pixels, the light blocking pattern including a plurality of first openings corresponding to the first and second sub-emission areas of the first pixel, a plurality of second openings corresponding to the first and second sub-emission areas of the second pixel, and a plurality of third openings corresponding to the first and second sub-emission areas of the third pixel.

10. The display device of claim 9, wherein a size of each of the first openings is smaller than a size of each of the second and third openings.

11. The display device of claim 8, wherein the second light-emitting elements are second color light-emitting elements, and
the third light-emitting elements are third color light-emitting elements.

12. The display device of claim 8, wherein the second and third light-emitting elements are first color light-emitting elements, and
the display device further comprises a first color conversion layer on the second pixel to convert a first color light emitted from the second light-emitting elements into a second color light, and a second color conversion layer on the third pixel to convert the first color light emitted from the third light-emitting elements into a third color light.

13. The display device of claim 12, wherein the first color conversion layer is between the second light-emitting elements and the second color filter, and the second color conversion layer is between the third light-emitting elements and the third color filter.

14. The display device of claim 13, wherein the first and second color conversion layers are on one surface of a substrate on which the first to third color filters are located.

15. The display device of claim 13, wherein the first and second color conversion layers are on one surface of a base layer on which the first to third light-emitting elements are located, and
the first to third color filters are disposed on one surface of a substrate so as to face the one surface of the base layer.

16. The display device of claim 13, wherein the first and second color conversion layers and the first to third color filters are sequentially formed on one surface of a base layer on which the first to third light-emitting elements are located, and
wherein the display device further comprises an encapsulation layer configured to cover the one surface of the base layer on which the first to third color filters are located.

17. The display device of claim 12, wherein the first, second, and third light-emitting elements are blue light-emitting elements,
wherein the first, second, and third color filters are a blue color filter, a green color filter, and a red color filter, respectively, and
wherein the first and second color conversion layers comprise green quantum dots and red quantum dots, respectively.

18. The display device of claim 7, wherein at least a portion of the first color filter is located between the first sub-emission area and the second sub-emission area of each of the first, second, and third pixels so as to overlap the light blocking pattern.

19. A display device comprising:
a first pixel including a first sub-emission area and a second sub-emission area that are spaced from each other, and first light-emitting elements in the first and second sub-emission areas, the first light-emitting elements being configured to emit light having a first color;
a light blocking pattern on the first pixel to cover an area between the first sub-emission area and the second sub-emission area and including a plurality of openings respectively corresponding to the first and second sub-emission areas; and
a first color filter comprising a plurality of first color filter patterns on the first and second sub-emission areas,
wherein the first pixel comprises:
a first electrode and a second electrode in the first sub-emission area;
at least one of the first light-emitting elements in the first sub-emission area and connected between the first electrode and the second electrode;
a third electrode and a fourth electrode in the second sub-emission area;
at least one of the first light-emitting elements in the second sub-emission area and connected between the third electrode and the fourth electrode; and
at least one contact electrode configured to connect any one of the first and second electrodes and any one of the third and fourth electrodes.

* * * * *